United States Patent
Chen et al.

(10) Patent No.: US 9,166,167 B2
(45) Date of Patent: Oct. 20, 2015

(54) P-TYPE MATERIALS AND ORGANIC ELECTRONIC DEVICES

(75) Inventors: Zhikuan Chen, Singapore (SG); Jun Li, Singapore (SG); Beng Ong, Singapore (SG); Prashant Sonar, Singapore (SG); Kok Haw Ong, Singapore (SG); Ging Meng Ng, Singapore (SG); Siew Lay Lim, Singapore (SG); Samarendra Pratap Singh, Singapore (SG); Yuning Li, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 0 days.

(21) Appl. No.: 13/393,222

(22) PCT Filed: Apr. 30, 2010

(86) PCT No.: PCT/SG2010/000175
§ 371 (c)(1),
(2), (4) Date: Feb. 28, 2012

(87) PCT Pub. No.: WO2011/025455
PCT Pub. Date: Mar. 3, 2011

(65) Prior Publication Data
US 2012/0161117 A1  Jun. 28, 2012

Related U.S. Application Data

(60) Provisional application No. 61/272,182, filed on Aug. 28, 2009.

(51) Int. Cl.
*C08G 59/00* (2006.01)
*H01L 51/00* (2006.01)
*H01L 51/05* (2006.01)

(52) U.S. Cl.
CPC ......... *H01L 51/0036* (2013.01); *H01L 51/0545* (2013.01)

(58) Field of Classification Search
CPC .. C08G 61/123; C08G 61/12; C08G 73/0611; C08G 73/0688; C08G 73/0694; C09K 11/06; C09K 2211/1029; H01L 51/0035; H01L 51/0036; H01L 51/0067; Y02E 10/549
USPC .......... 528/407, 163, 94, 117, 118, 360, 367; 257/40, E51.005, E51.024
See application file for complete search history.

(56) References Cited

U.S. PATENT DOCUMENTS 6,791,129 B2   9/2004   Inukai
7,112,679 B2   9/2006   Zhou et al.
(Continued)

FOREIGN PATENT DOCUMENTS

CA   2 625 306 A1   9/2009
EP   2 033 983 A2   3/2009
(Continued)

OTHER PUBLICATIONS

Bundgaard, Eva, et al., "Low Band Gap Polymers for Organic Solar Cells", Proc. of SPIE, vol. 6334, pp. 63340T-1-63340T-10, (2006).
(Continued)

*Primary Examiner* — Shane Fang
(74) *Attorney, Agent, or Firm* — Blakely, Sokoloff, Taylor & Zafman LLP

(57) ABSTRACT

There is presently provided compounds of formula (I), which are useful as p-type semiconductor materials and in devices comprising such p-type semiconductor materials.

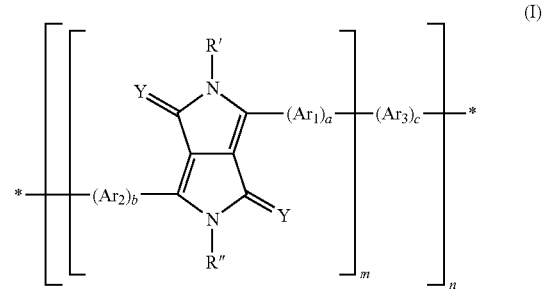

15 Claims, 5 Drawing Sheets

(56) References Cited

U.S. PATENT DOCUMENTS

| | | | |
|---|---|---|---|
| 7,132,500 B2 | 11/2006 | Ong et al. | |
| 7,132,682 B2 | 11/2006 | Ong et al. | |
| 7,141,644 B2 | 11/2006 | Ong et al. | |
| 7,223,484 B2 | 5/2007 | Stössel et al. | |
| 7,244,809 B2 | 7/2007 | Giles et al. | |
| 7,282,733 B2 | 10/2007 | Ong et al. | |
| 7,294,288 B2 | 11/2007 | Koller et al. | |
| 7,368,510 B2 | 5/2008 | Lee et al. | |
| 7,517,945 B2 | 4/2009 | Ong et al. | |
| 7,541,424 B2 | 6/2009 | Jeong et al. | |
| 8,329,915 B2 | 12/2012 | Moawia et al. | |
| 2003/0186079 A1 | 10/2003 | Towns et al. | |
| 2005/0082525 A1* | 4/2005 | Heeney et al. | 257/40 |
| 2006/0081839 A1 | 4/2006 | Jeong et al. | |
| 2006/0113527 A1 | 6/2006 | Han et al. | |
| 2007/0090371 A1 | 4/2007 | Drechsel et al. | |
| 2007/0228359 A1* | 10/2007 | Heim et al. | 257/40 |
| 2008/0197768 A1 | 8/2008 | Conway et al. | |
| 2008/0315187 A1 | 12/2008 | Bazan et al. | |
| 2009/0032106 A1 | 2/2009 | Sellinger et al. | |
| 2009/0032808 A1 | 2/2009 | Bazan et al. | |
| 2009/0065766 A1 | 3/2009 | Li | |
| 2009/0065878 A1 | 3/2009 | Li | |
| 2009/0171048 A1 | 7/2009 | Chan et al. | |
| 2010/0006154 A1 | 1/2010 | Kitazawa et al. | |
| 2010/0327273 A1 | 12/2010 | Li et al. | |
| 2010/0331550 A1 | 12/2010 | Moawia et al. | |
| 2011/0023964 A1 | 2/2011 | Kitazawa et al. | |
| 2011/0121273 A1 | 5/2011 | Jo et al. | |
| 2011/0156018 A1 | 6/2011 | Moriwaki et al. | |
| 2011/0201777 A1 | 8/2011 | Kondou et al. | |
| 2012/0156829 A1 | 6/2012 | Chen et al. | |

FOREIGN PATENT DOCUMENTS

| | | |
|---|---|---|
| EP | 2 034 537 A2 | 3/2009 |
| EP | 2 327 734 A1 | 6/2011 |
| EP | 2 338 925 A1 | 6/2011 |
| JP | 2001-515933 A | 9/2001 |
| JP | 2008-266459 A | 6/2008 |
| JP | 2009-155648 A | 7/2009 |
| JP | 2009-158921 A | 7/2009 |
| JP | 2009-267196 A | 11/2009 |
| JP | 2010-018790 A | 1/2010 |
| JP | 2010-520322 A | 10/2010 |
| WO | WO 99/12989 | 3/1999 |
| WO | WO 2005/049695 A1 | 6/2005 |
| WO | WO 2005/073265 A1 | 8/2005 |
| WO | WO 2007/136351 A1 | 11/2007 |
| WO | WO 2008/000664 A1 | 1/2008 |
| WO | WO 2008/044585 A1 | 4/2008 |
| WO | WO 2008/106019 | 9/2008 |
| WO | WO 2008/127029 A1 | 10/2008 |
| WO | WO 2009/105041 A1 | 8/2009 |
| WO | WO 2009/105042 A1 | 8/2009 |
| WO | WO 2009/125647 A1 | 10/2009 |
| WO | WO 2009/139339 A1 | 11/2009 |
| WO | WO 2010/026972 A1 | 3/2010 |
| WO | WO 2010/036494 A1 | 4/2010 |
| WO | WO 2010/044470 A1 | 4/2010 |
| WO | WO 2010/096019 A1 | 8/2010 |

OTHER PUBLICATIONS

Bundgaard, Eva, et al., "Low-Band-Gap Conjugated Polymers Based on Thiophene, Benzothiadiazole, and Benzobis(thiadiazole)", Macromolecules, vol. 39, pp. 2823-2831, (2006).

Bundgaard, Eva, et al., "Bulk Heterojunctions Based on a Low Band Gap Copolymer of Thiophene and Benzothiadiazole", Solar Energy Materials and Solar Cells, vol. 91, pp. 1631-1637, (2007).

Melucci, Manuela, et al., "Liquid-Crystalline Rigid-Core Semiconductor Oligothiophenes: Influence of Molecular Structure on Phase Behaviour and Thin-Film Properties", Chemistry: A European Journal, vol. 13, pp. 10046-10054, (2007).

First Office Action for Chinese Patent Application No. 201080041373.3, 13 pages, (Apr. 28, 2013).

PCT International Search Report for PCT Counterpart Application No. PCT/SG2010/000175, 3 pgs., (Jul. 12, 2010).

PCT Written Opinion of the International Searching Authority for PCT Counterpart Application No. PCT/SG2010/000175, 3 pgs., (Jul. 12, 2010).

PCT Notification concerning Transmittal of International Preliminary Report on Patentability (Chapter I of the Patent Cooperation Treaty) for PCT Counterpart Application No. PCT/SG2010/000175, 5 pgs., (Mar. 8, 2012).

PCT International Search Report for PCT Application No. PCT/SG2010/000174, 4 pgs., (Jul. 12, 2010).

PCT Written Opinion of the International Searching Authority for PCT Application No. PCT/SG2010/000174, 7 pgs., (Jul. 12, 2010).

Response to PCT Written Opinion mailed Jul. 12, 2010 and PCT Demand for PCT Application No. PCT/SG2010/000174, 50 pgs., (Jun. 28, 2011).

PCT Written Opinion of the International Preliminary Examining Authority for PCT Application No. PCT/SG2010/000174, 5 pgs., (Aug. 26, 2011).

Response to PCT Written Opinion mailed Aug. 26, 2011 for PCT Application No. PCT/SG2010/000174, 33 pgs., (Oct. 25, 2011).

PCT Notification of Transmittal of International Preliminary Report on Patentability (Chapter II of the Patent Cooperation Treaty) for PCT Application No. PCT/SG2010/000174, 6 pgs., (Dec. 7, 2011).

J. C. Bernède, "Organic Photovoltaic Cells: History, Principle and Techniques", Journal of the Chilean Chemical Society, vol. 53, Issue 3, pp. 1549-1564, (2008).

Renee Kroon, et al., "Small Bandgap Polymers for Organic Solar Cells (Polymer Material Development in the Last 5 Years)", Polymer Reviews, vol. 48, Issue 3, pp. 531-582, (2008).

Eva Bundgaard, et al., "Low Band Gap Polymers for Organic Photovoltaics", Solar Energy Materials and Solar Cells, vol. 91, Issue 11, pp. 954-985, (Jul. 6, 2007).

Serap Gunes, et al., "Conjugated Polymer-Based Organic Solar Cells", Chemical Reviews, vol. 107, Issue 4, pp. 1324-1338, (Apr. 2007).

L. H. Slooff, et al., "Determining the Internal Quantum Efficiency of Highly Efficient Polymer Solar Cells through Optical Modeling", Applied Physics Letters, vol. 90, Article 143506, 4 pgs., (Apr. 2, 2007).

Nicolas Blouin, et al., "A Low-Bandgap Poly(2,7-Carbazole) Derivative for Use in High-Performance Solar Cells", Advanced Materials, vol. 19, Issue 17, pp. 2295-2300, (Sep. 2007).

Jianping Lu, et al., "Crystalline Low Band-Gap Alternating Indolocarbazole and Benzothiadiazole-Cored Oligothiophene Copolymer for Organic Solar Cell Applications," Chemical Communications, Issue 42, pp. 5315-5317, (2008).

David Mühlbacher, et al., "High Photovoltaic Performance of a Low-Bandgap Polymer", Advanced Materials, vol. 18, Issue 21, pp. 2884-2889, (Nov. 2006).

Zhengguo Zhu et al., "Panchromatic Conjugated Polymers Containing Alternating Donor/Acceptor Units for Photovoltaic Applications", Macromolecules, vol. 40, Issue 6, pp. 1981-1986, (Mar. 20, 2007).

J. Peet, et al., "Efficiency Enhancement in Low-Bandgap Polymer Solar Cells by Processing with Alkane Dithiols", Nature Materials, vol. 6, Issue 7, pp. 497-500, (Jul. 2007).

Jianhui Hou, et al., "Synthesis, Characterization, and Photovoltaic Properties of a Low Band Gap Polymer Based on Silole-Containing Polythiophenes and 2,1,3-Benzothiadiazole", Journal of the American Chemical Society, vol. 130, Issue 48, pp. 16144-16145, (Dec. 3, 2008).

Ergang Wang, et al., "High-Performance Polymer Heterojunction Solar Cells of a Polysilafluorene Derivative", Applied Physics Letters, vol. 92, Issue 3, Article 033307, 4 pgs., (Jan. 21, 2008).

Yongye Liang, et al., "Development of New Semiconducting Polymers for High Performance Solar Cells", Journal of the American Chemical Society, vol. 131, Issue 1, pp. 56-57, (Jan. 14, 2009).

Martijn M. Wienk, et al., "Narrow-Bandgap Diketo-Pyrrolo-Pyrrole Polymer Solar Cells: The Effect of Processing on the Performance", Advanced Materials, vol. 20, Issue 13, pp. 2556-2560, (Jul. 2, 2008).

(56) References Cited

OTHER PUBLICATIONS

Arnold B. Tamayo, et al., "A Low Band Gap, Solution Processable Oligothiophene with a Diketopyrrolopyrrole Core for Use in Organic Solar Cells", The Journal of Physical Chemistry C, vol. 112, Issue 30, pp. 11545-11551, (Jul. 31, 2008).
Yingping Zou, et al., "A High-Mobility Low-Bandgap Poly(2,7-carbazole) Derivative for Photovoltaic Applications", Macromolecules, vol. 42, Issue 8, pp. 2891-2894, (Apr. 28, 2009).
Y. Zhu, et al., "Highly Luminescent 1,4-Diketo-3,6-diphenylpyrrolo[3,4-c]pyrrole-(DPP-) Based Conjugated Polymers Prepared Upon Suzuki Coupling", Macromolecules, vol. 40, Issue 19, pp. 6981-6989, (Sep. 18, 2007).
Henry M. P. Wong, et al., "Donor and Acceptor Behavior in a Polyfluorene for Photovoltaics", The Journal of Physical Chemistry C, vol. 111, Issue 13, pp. 5244-5249, (Apr. 5, 2007).
Felix Sunjoo Kim, et al., "High-Mobility Ambipolar Transistors and High-Gain Inverters from a Donar-Acceptor Copolymer Semiconductor", Advanced Materials, vol. 22, Issue 4, pp. 478-482, (Jan. 26, 2010).
Shiming Zhang, et al., "Low Bandgap π-Conjugated Copolymers based on Fused Thiophenes and Benzothiadiazole: Synthesis and Structure-Property Relationship Study", Journal of Polymer Science, Part A: Polymer Chemistry, vol. 47, Issue 20, pp. 5498-5508, (2009).
Yuning Li, et al., "Poly(2,5-bis(2-thienyl)-3,6-dialkylthieno [3,2-b]thiophene)s—High-Mobility Semiconductors for Thin-Film Transistors", Advanced Materials, vol. 18, Issue 22, pp. 3029-3032, (Nov. 2006).
Sun Woong Kim, et al., "2.4-in. Monochrome Small Molecular OLED Display for Mobile Application", Current Applied Physics, vol. 2, Issue 4, pp. 335-338, (Aug. 2002).
Soon Wook Cha, et al., "Electroluminescence of LEDs Consisting Two Layers of Alq3 and High Tg, Blue-Light Emitting Branched Compounds", Synthetic Metals, vol. 143, Issue 1, pp. 97-101, (May 7, 2004).
Bong Soo Kim, et al., "Charge Mobilities and Luminescence Characteristics of Blue-Light Emitting Bent Carbazole Trimers Connected through Vinylene Linkers—Effect of Nitrile Substituents", Synthetic Metals, vol. 145, Issues 2-3, pp. 229-235, (Sep. 21, 2004).
Biniek, Laure, et al., "A [3,2-b]thienothiophene-alt-benzothiadiazole Copolymer for Photovoltaic Applications: Design, Synthesis, Material Characterization and Device Performances", Journal of Materials Chemistry, vol. 19, pp. 4946-4951, (2009).
Blom, Paul W. M., et al., "Device Physics of Polymer:Fullerene Bulk Heterojunction Solar Cells", Advanced Materials, vol. 19, pp. 1551-1566, (2007).
Chan, Hardy Sze On, et al., "Synthesis, Characterization and Applications of Thiophene-Based Functional Polymers", Progress in Polymer Science, vol. 23, pp. 1167-1231, (1998).
Chen, Chih-Ping, et al., "Low-Bandgap Poly(Thiophene-Phenylene-Thiophene) Derivatives with Broaden Absorption Spectra for Use in High-Performance Bulk-Heterojunction Polymer Solar Cells", Journal of the American Chemical Society, vol. 130, pp. 12828-12833, (2008).
Chen, Hsiang-Yu, et al., "Polymer Solar Cells with Enhanced Open-Circuit Voltage and Efficiency", Nature Photonics, vol. 3, pp. 649-653, (Nov. 2009).
Frey, Joseph, et al., "Improved Synthesis of dithieno[3,2-b:2',3'-d]thiophene (DTT) and Derivatives for Cross Coupling", Chemical Communications, vol. 20, pp. 2424-2425, (2002).
Gong, Cheng, et al., "Polymer Solar Cell based on poly(2,6-bis(3-alkylthiophen-2-yl)dithieno-[3,2-b;2',3'-d]thiophene)", Solar Energy Materials & Solar Cells, vol. 93, pp. 1928-1931, (2009).
Greenham, N. C., et al., "Efficient Light Emitting Diodes based on Polymers with High Electron Affinities", Nature, vol. 365, pp. 628-630, (Oct. 14, 1993).
Hughes, Gregory, et al., "Electron-Transporting Materials for Organic Electroluminescent and Electrophosphorescent Devices", Journal of Materials Chemistry, vol. 15, pp. 94-107, (2005).

PCT International Search Report and Written Opinion of the International Searching Authority issued in PCT Application No. PCT/SG2009/000393, 10 pages, (Dec. 24, 2009).
PCT International Preliminary Report on Patentability issued in PCT Application No. PCT/SG2009/000393, 4 pages, (Sep. 27, 2011).
PCT International Search Report and Written Opinion of the International Searching Authority issued in PCT Application No. PCT/SG2010/000172, 13 pages, (Jul. 29, 2010).
PCT International Preliminary Report on Patentability issued in PCT Application No. PCT/SG2010/000172, 4 pages, (Jul. 25, 2011).
PCT Notification of Transmittal of International Preliminary Report on Patentability (Chapter II of the Patent Cooperation Treaty) issued in PCT Application No. PCT/SG2010/000174, 6 pages, (Dec. 7, 2011).
PCT International Preliminary Report on Patentability (Chapter I of the Patent Cooperation Treaty) issued in PCT Application No. PCT/SG2010/000175, 4 pages, (Feb. 28, 2012).
Katz, Howard E., et al., "Synthetic Chemistry for Ultrapure, Processable, and High-Mobility Organic Transistor Semiconductors", Accounts of Chemical Research, vol. 34, No. 5, pp. 359-369, (2001).
Kietzke, Thomas, et al., "Efficient Polymer Solar Cells Based on M3EH-PPV", Chemistry of Materials, vol. 17, No. 26, pp. 6532-6537, (2005).
Kietzke, Thomas, et al., "Effect of Annealing on the Characteristics of Organic Solar Cells: Polymer Blends with a 2-Vinyl-4,5-dicyanoimidazole Derivative", Macromolecules, vol. 40, No. 13, pp. 4424-4428, (2007).
Kitamura, Chitoshi, et al., "Synthesis and Properties of a New Ethyne-Linked Donor/Acceptor Pentamer", Tetrahedron Letters, vol. 43, pp. 3373-3376, (2002).
Kulkarni, Abhishek P., et al., "Electron Transport Materials for Organic Light-Emitting Diodes", Chemistry of Materials, vol. 16, No. 23, pp. 4556-4573, (2004).
Li, Jun, et al., "High-Performance Thin-Film Transistors from Solution-Processed Dithienothiophene Polymer Semiconductor Nanoparticles", Chemistry of Materials, vol. 20, No. 6, pp. 2057-2059, (Mar. 25, 2008).
Li, Ji-Cheng, et al., "Synthesis and Characterization of a Thiophene-Benzothiadiazole Copolymer", Macromolecular Research, vol. 17, No. 5, pp. 356-360, (2009).
Li, Yongfang, et al., "Conjugated Polymer Photovoltaic Materials with Broad Absorption Band and High Charge Carrier Mobility", Advanced Materials, vol. 20, pp. 2952-2958, (2008).
Liang, Fushun, et al., "Design and Synthesis of Alternating Regioregular Oligothiophenes/Benzothiadiazole Copolymers for Organic Solar Cells", Macromolecules, vol. 42, No. 16, pp. 6107-6114, (2009).
Lloyd, Matthew T., et al., "Photovoltaics from Soluble Small Molecules", Materials Today, vol. 10, No. 11, pp. 34-41, (Nov. 2007).
Ma, Wanli, et al., "Thermally Stable, Efficient Polymer Solar Cells with Nanoscale Control of the Interpenetrating Network Morphology", Advanced Functional Materials, vol. 15, pp. 1617-1622, (2005).
Mayer, Alex C., et al., "Polymer-Based Solar Cells", Materials Today, vol. 10, No. 11, pp. 28-33, (Nov. 2007).
McCulloch, Iain, et al., "Liquid-Crystalline Semiconducting Polymers with High Charge-Carrier Mobility", Nature Materials, vol. 5, pp. 328-333, (Apr. 2006).
Meier, Herbert, et al., "The Effect of 2,2-dicyanovinyl Groups as Electron Acceptors in Push-Pull Substituted oligo(1,4-phenylenevinylene)s", Tetrahedron Letters, vol. 44, pp. 1915-1918, (2003).
Meier, Herbert, "Conjugated Oligomers with Terminal Donor-Acceptor Substitution", Angewandte Chemie International Edition, vol. 44, pp. 2482-2506, (2005).
Ong, Beng S., et al., "High-Performance Semiconducting Polythiophenes for Organic Thin-Film Transistors", Journal of the American Chemical Society, vol. 126, No. 11, pp. 3378-3379, (2004).
Ooi, Zi En, et al., "Solution Processable Bulk-Heterojunction Solar Cells using a Small Molecule Acceptor", Journal of Materials Chemistry, vol. 18, pp. 4619-4622, (2008).

(56) References Cited

OTHER PUBLICATIONS

Pan, Hualong, et al., "Benzodithiophene Copolymer—A Low-Temperature, Solution-Processed High-Performance Semiconductor for Thin-Film Transistors", Advanced Functional Materials, vol. 17, pp. 3574-3579, (2007).
Pan, Hualong, et al., "Low-Temperature, Solution-Processed, High-Mobility Polymer Semiconductors for Thin-Film Transistors", Journal of the American Chemical Society, vol. 129, No. 14, pp. 4112-4113, (2007).
Peet, J., et al., "Efficiency Enhancement in Low-Bandgap Polymer Solar Cells by Processing with Alkane Dithiols", Nature Materials, vol. 6, pp. 497-500, (Jul. 2007).
Salleo, A., et al., "Polymer Thin-Film Transistors with Chemically Modified Dielectric Interfaces", Applied Physics Letters, vol. 81, No. 23, pp. 4383-4385, (Dec. 2, 2002).
Shin, Richard Yee Cheong, et al., "N-Type Conjugated Materials Based on 2-Vinyl-4,5-dicyanoimidazoles and Their Use in Solar Cells", Chemistry of Materials, vol. 19, No. 8, pp. 1892-1894, (2007).
Shin, Richard Y. C., et al., "Electron-Accepting Conjugated Materials Based on 2-Vinyl-4,5-dicyanoimidazoles for Application in Organic Electronics", Journal of Organic Chemistry, vol. 74, No. 9, pp. 3293-3298, (2009).
Sirringhaus, Henning, et al., "Integrated Optoelectronic Devices Based on Conjugated Polymers", Science, vol. 280, pp. 1741-1744, (Jun. 12, 1998).
Sirringhaus, H., et al., "Two-Dimensional Charge Transport in Self-Organized, High-Mobility Conjugated Polymers", Nature, vol. 401, pp. 685-688, (Oct. 14, 1999).
Subbiah, Jegadesan, et al., "Efficient Green Solar Cells via a Chemically Polymerizable Donor-Acceptor Heterocyclic Pentamer", ACS Applied Materials & Interfaces, vol. 1, No. 6, pp. 1154-1158, (2009).
Takahashi, Masabumi, et al., "Palladium-Catalyzed C—H Homocoupling of Bromothiophene Derivatives and Synthetic Application to Well-Defined Oligothiophenes", Journal of the American Chemical Society, vol. 128, No. 33, pp. 10930-10933, (2006).
Thelakkat, Mukundan, "Star-Shaped, Dendrimeric and Polymeric Triarylamines as Photoconductors and Hole Transport Materials for Electro-Optical Applications", Macromolecular Materials and Engineering, vol. 287, No. 7, pp. 442-461, (2002).
Winder, Christoph, et al., "Low Bandgap Polymers for Photon Harvesting in Bulk Heterojunction Solar Cells", Journal of Materials Chemistry, vol. 14, pp. 1077-1086, (2004).
Wong, Man Shing, et al., "Synthesis and Functional Properties of Donor-Acceptor π-Conjugated Oligomers", Chemistry of Materials, vol. 15, No. 5, pp. 1198-1203, (2003).
Yu, Chao-Ying, et al., "Thiophene/Phenylene/Thiophene-Based Low-Bandgap Conjugated Polymers for Efficient Near-Infrared Photovoltaic Applications", Chemistry of Materials, vol. 21, pp. 3262-3269, (2009).
Yue, Wei, et al., "Poly(oligothiophene-*alt*-benzothiadiazole)s: Tuning the Structures of Oligothiophene Units toward High-Mobility "Black" Conjugated Polymers", Macromolecules, vol. 42, No. 17, pp. 6510-6518, (2009).
Zhang, Xin, et al., "Donor/Acceptor Vinyl Monomers and their Polymers: Synthesis, Photochemical and Photophysical Behaviour", Progress in Polymer Science, vol. 31, pp. 893-948, (2006).
Zhang, Shiming, et al., "Synthesis of a Soluble Conjugated Copolymer based on Dialkyl-Substituted Dithienothiophene and its Application in Photovoitaic Cells", Polymer, vol. 50, pp. 3595-3599, (2009).
Zhu, Zhengguo, et al., "Panchromatic Conjugated Polymers Containing Alternating Donor/Acceptor Units for Photovoltaic Applications", Macromolecules, vol. 40, No. 6, pp. 1981-1986, (2007).
He, et al., "Structure vs. Property Relationship in High Mobility Fused Thiophene Polymers", Proc. of SPIE, vol. 7417, 2009, pp. 74170F-1 to 74170F-11.
Extended European Search Report mailed Jan. 7, 2014 in related EP Patent Application No. 10812410.8 (12 pages).
Notice of Reasons for Rejection mailed Nov. 6, 2013 in related JP Patent Application No. 2012-526691 (8 pages).
Official Letter and Search Report issued on Jan. 22, 2015 in related TW Patent Application No. 99124348.

\* cited by examiner

P-TYPE MATERIALS AND ORGANIC ELECTRONIC DEVICES

CROSS-REFERENCE TO RELATED APPLICATION

This patent application is a U.S. National Phase Application under 35 U.S.C. §371 of International Application No. PCT/SG2010/000175, filed on Apr. 30, 2010, entitled P-TYPE MATERIALS AND ORGANIC ELECTRONIC DEVICES, which claims benefit of, and priority from, U.S. provisional patent application No. 61/272,182, filed on Aug. 28, 2009, the contents of which are hereby incorporated herein by reference.

FIELD OF THE INVENTION

The present invention relates to organic compounds, p-type semiconductor materials derived from such compounds and devices comprising such p-type semiconductor materials.

BACKGROUND OF THE INVENTION

Organic light-emitting diodes (OLEDs), organic field-effect transistors (OFETs), organic thin film transistors (OTFTs), and organic solar cells (also referred to as organic photovoltaics or OPVs) based on organic molecules have been extensively studied. Such devices are becoming increasingly popular due to their low-cost processing, relatively simple packaging, and compatibility with flexible substrates.

More specifically, OPVs come with the promise of efficient conversion of sunlight into direct usable electrical energy at a much lower cost than the traditional silicon based solar cells.

OPVs may often contain a mixture of two or more organic materials: at least one material that can act as an electron donor (p-type) and at least one material that can act as electron acceptor (n-type).

Many new materials and new processes have recently been developed for use in OPVs. The most investigated polymeric solar cells are made with regioregular poly(3-hexylthiophene) (P3HT) as donor (p-type) material, which may achieve an efficiency surpassing 5%. However, the main disadvantage of this polymer is the poor matching of its photon absorbance with the solar spectrum. The bandgap of P3HT is around 1.9 eV, limiting the absorption of sunlight to below a wavelength of 650 nm. It has been calculated that with an absorption limit of up to 650 nm only 22.4% of the total amount of photons from sunlight can be harvested.

Since low bandgap polymers can increase the total amount of photons harvested from the solar spectrum, they are potentially more efficient for polymeric solar cells. A low bandgap can be achieved by using alternating donor-acceptor based structures in the polymer backbone. A number of low bandgap polymers have been reported for OPV application.

However, narrowing the polymeric bandgap may result in a decrease of the open circuit voltage, which may eventually result in a decrease in power conversion efficiency. When low bandgap donor polymers are paired with the most commonly used acceptor material, [6,6]-phenyl-C61-butyric acid methyl ester (PCBM), the calculated optimal bandgap of the donor polymer is from 1.3 to 1.9 eV for high power conversion efficiency.

The decrease in PCE in OPVs may be due, at least partly, to the fact that, as the absorption band shifts to longer wavelengths, absorption in the short wavelength range may often become weak. Thus shifting to longer wavelengths may not significantly contribute to the overall exciton generation in devices.

Organic semiconductors are also an important component used as channel material in organic thin film transistors (OTFTs). With compared to silicon-based TFTs, OTFTs, especially polymer-based OTFTs, can be fabricated much more cost effectively using solution deposition techniques such as ink jet printing, screen printing, gravure printing, casting, and spin-coating. OTFTs may also offer other attractive features such as flexibility, robustness, and light weight. OTFTs can be used as components in a range of potential applications, which include displays, e-paper, radio-frequency identification tags (RFIDs), bio- and chemosensors. However, the currently available polymer semiconductors suffer low mobility below 0.1 $cm^2/V \cdot s$, which limits the application of OTFTs.

Accordingly, there is a need for production of alternative p-type organic materials useful for production of efficient electronic devices, including OPVs and OTFTs.

SUMMARY OF THE INVENTION

The present invention relates to low bandgap p-type organic compounds that include a diketopyrrolopyrrole, dithioketopyrrolopyrrole or diselenoketopyrrolopyrrole group (each referred to herein as DPP groups), which may exhibit broad absorption spectra. The incorporation of rigid fused electron-rich aromatic building blocks into the p-type compound backbone facilitates molecular packing, which may allow for high charge mobility, which is beneficial in OPV and OTFT applications.

Thus, the p-type compounds of the invention incorporate two or more different co-monomers, in which at least one monomer is an electron-deficient DPP monomer and at least one monomer comprises an electron-rich, rigid fused aromatic or heteroaromatic group. The compounds thus contain both donor groups and acceptor groups, thus reducing the bandgap of the compounds.

The p-type compounds of the invention may be of low bandgap (<1.9 eV) and may have broad absorption band, and thus may exhibit higher light absorption efficiency than commonly used p-type materials for OPVs, such as P3HT. The p-type compounds of the invention may also have high hole mobility of >0.1 $cm^2/V \cdot s$., especially useful for OTFTs.

The p-type compounds of the invention may be used as the active material in solar cells, photo-detectors, thin film transistors.

The p-type compounds may be used as the active layer for OPVs by blending with a suitable n-type acceptor material, including for example [6,6]-phenyl-C61-butyric acid methyl ester (PCBM), to form a heterojunction structure. Alternatively, p-type compounds of the invention may be paired with a suitable n-type material to form a bilayer device structure, either in a single cell or tandem cells. The p-type compounds may also be used as the channel material in OTFTs.

The p-type compounds of the invention may be readily solution processable and thus may be applied in OPVs, OTFTs, or other electronic devices through various types of solution processing.

In one aspect the invention provides a compound of formula I:

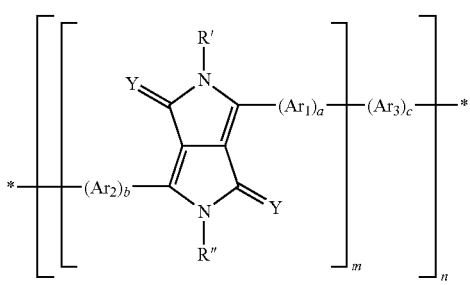
wherein Y is O, S or Se; each R' and R" is independently H or a hydrocarbon optionally containing one or more heteroatoms in the backbone; each $Ar_1$ and $Ar_2$ is independently arylene, heteroarylene, —CH=CH—, —C≡C—, CH=N—, —N=N— or —N=P—, any of which may be optionally substituted; each $Ar_3$ is independently one of the following A1 to A22 groups:
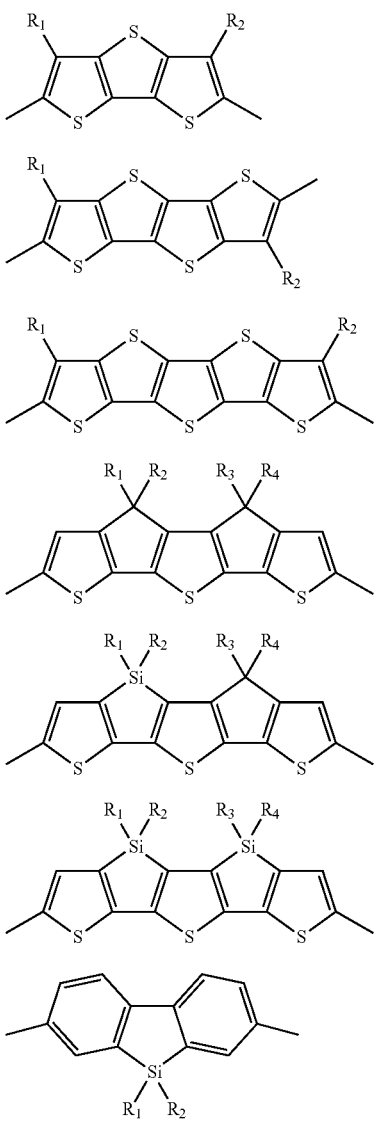
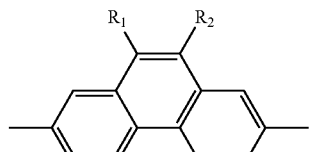
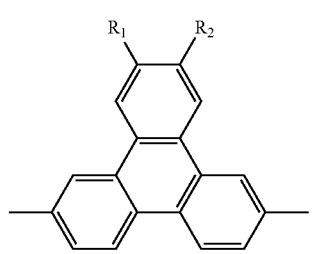
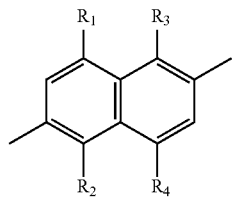
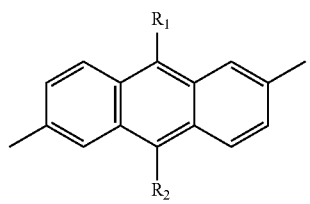
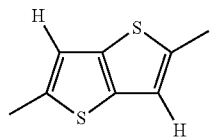
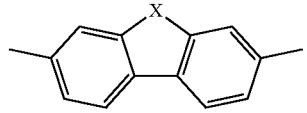
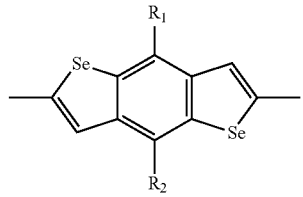
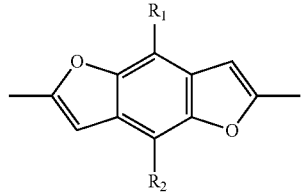

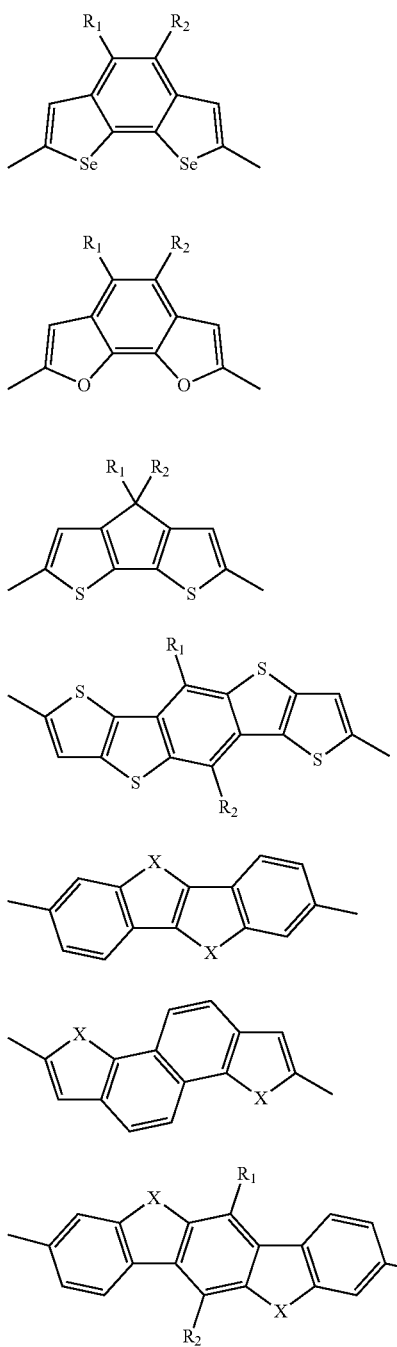

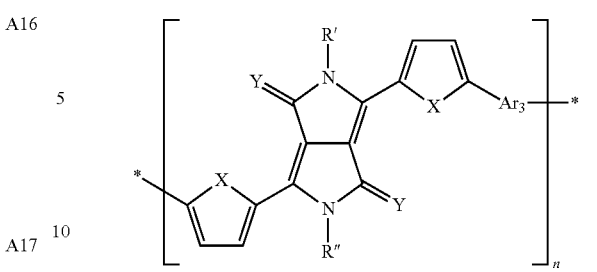

each of $R_1$, $R_2$, $R_3$ and $R_4$ a hydrogen; straight or branched alkyl or heteroalkyl having from 1 to 40 backbone atoms; or aryl or heteroaryl having from 5 to 40 backbone atoms, any of which may be optionally substituted with one or more F, Cl, CN, $CO_2H$, $SO_3H$ or $NO_2$ groups; X is O, S or Se; each a and b is an integer from 0 to 20; each c and m is an integer from 1 to 20; and n is an integer from 2 to 5000.

In some embodiments, the compound may have a formula of formula Ia, wherein each R' and R" is independently a straight alkyl, straight heteroalkyl, branched alkyl or branched heteroalkyl group, any of which having from 1 to 50 backbone atoms.

In certain embodiments, the compound may be one of the following compounds Ia-1 to Ia-46d, wherein each of R and $R_1$ is independently a straight or branched alkyl or heteroalkyl having from 1 to 40 backbone atoms, or aryl or heteroaryl having from 5 to 40 backbone atoms, any of which may be optionally substituted with one or more F, Cl, CN, $CO_2H$, $SO_3H$ or $NO_2$ groups; and n is an integer from 2 to 5000.

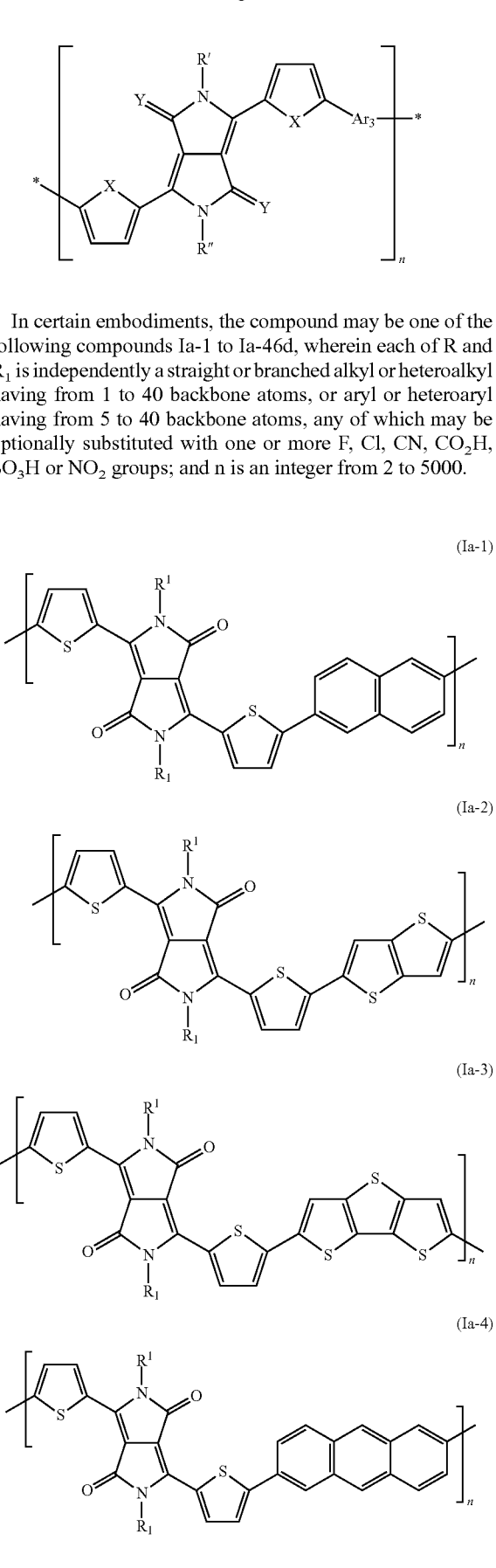

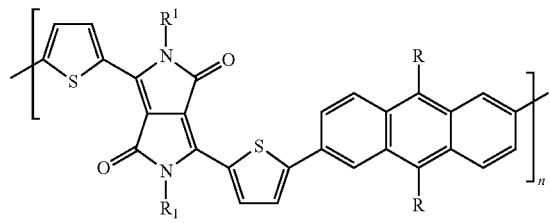
(Ia-5)
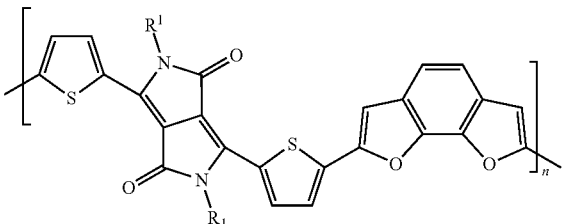
(Ia-11)
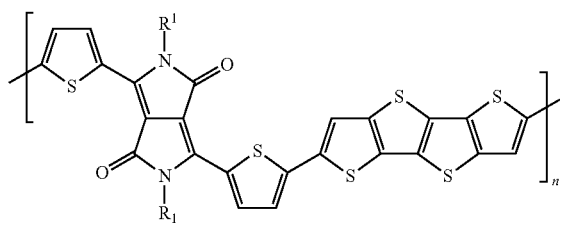
(Ia-6)
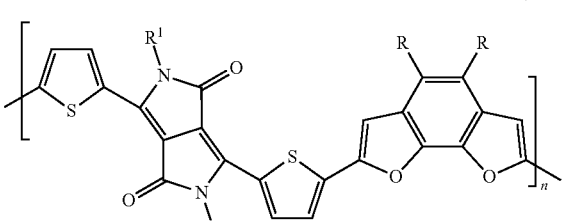
(Ia-12)
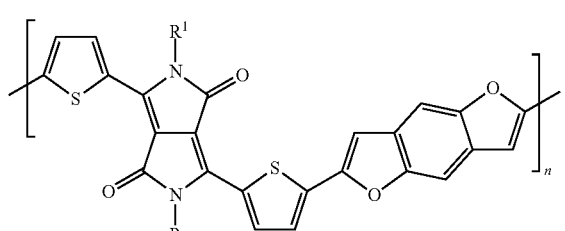
(Ia-7)
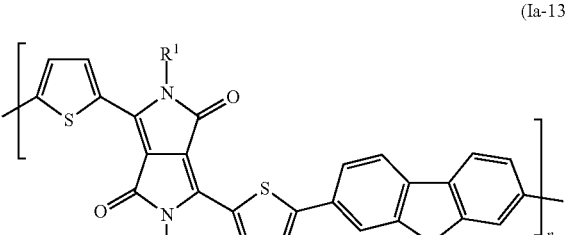
(Ia-13)
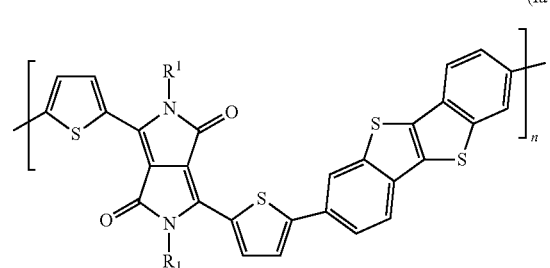
(Ia-8)
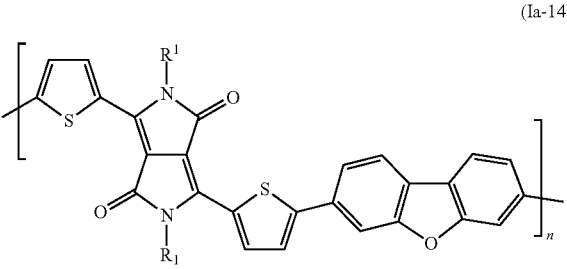
(Ia-14)
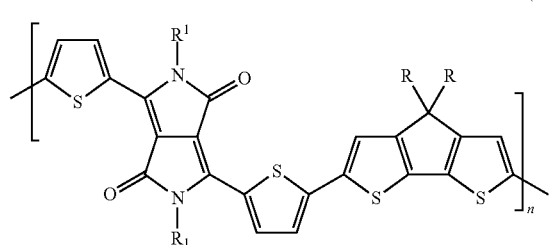
(Ia-9)
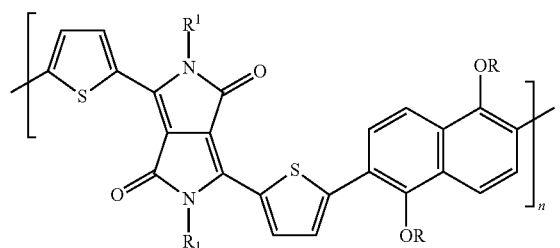
(Ia-15)
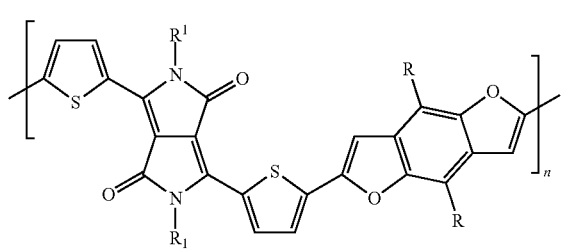
(Ia-10)
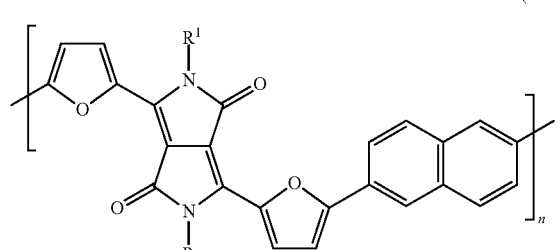
(Ia-16)

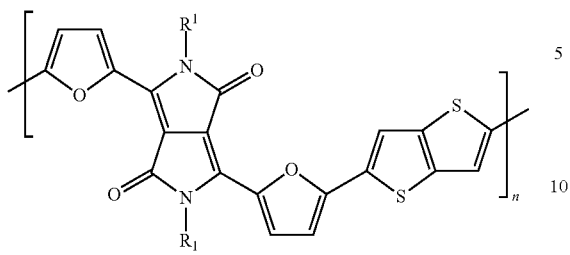
(Ia-17)
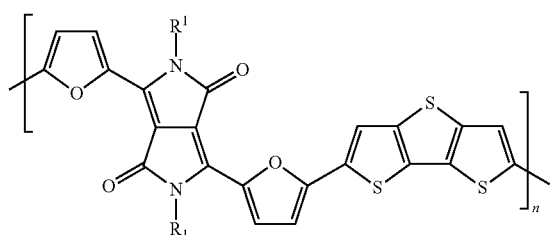
(Ia-18)
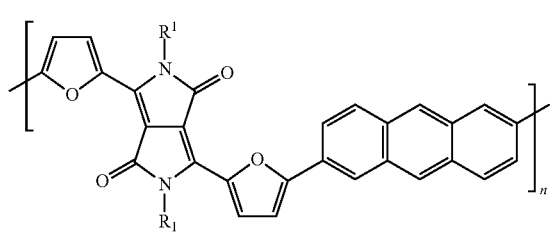
(Ia-19)
(Ia-20)
(Ia-21)
(Ia-22)
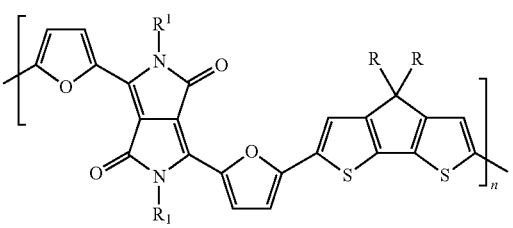
(Ia-23)
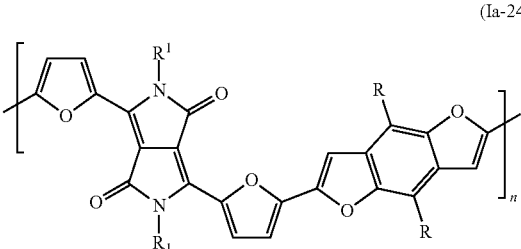
(Ia-24)
(Ia-25)
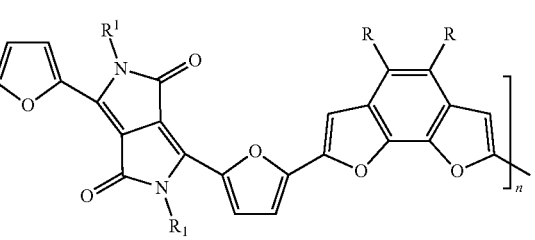
(Ia-26)
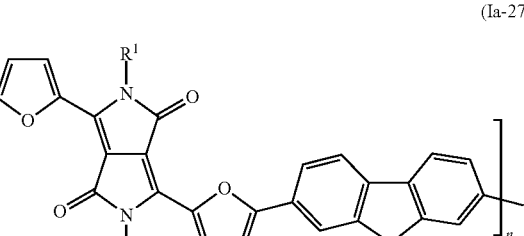
(Ia-27)
(Ia-28)
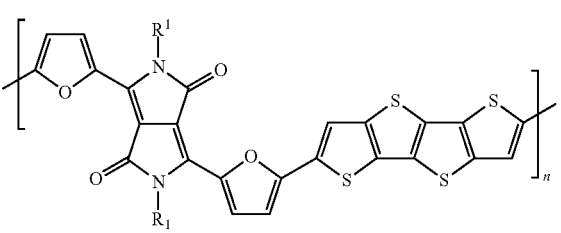

-continued
(Ia-29)
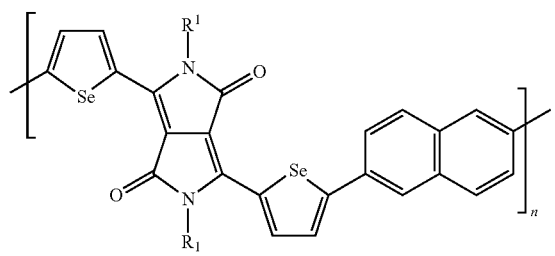
(Ia-30)
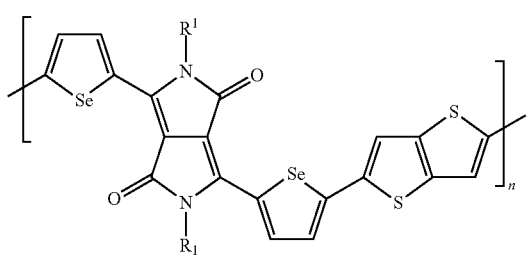
(Ia-31)
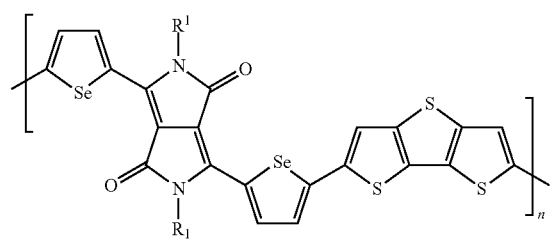
(Ia-32)
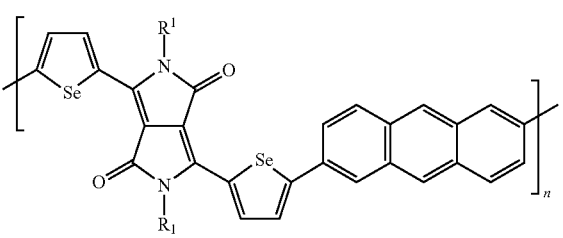
(Ia-33)
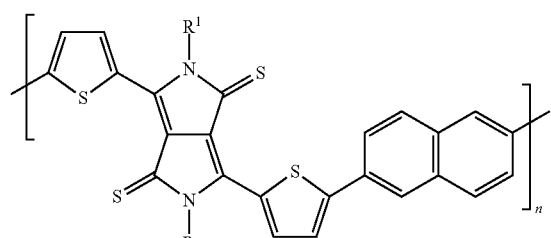
(Ia-34)
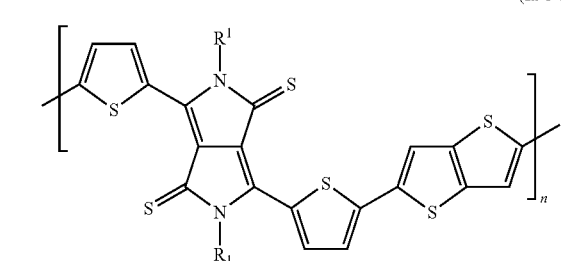
(Ia-35)
(Ia-36)
(Ia-37)
(Ia-38)
(Ia-39)
(Ia-40)
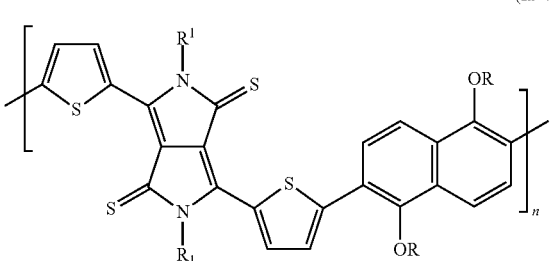

13
-continued (Ia-41)
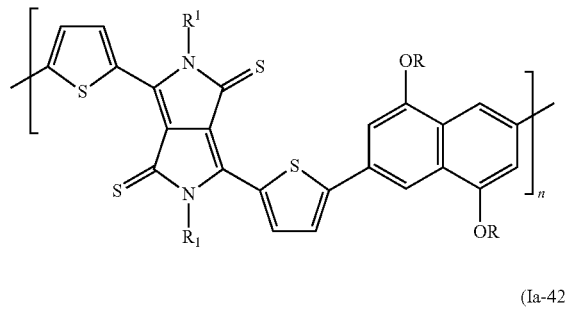

(Ia-42)
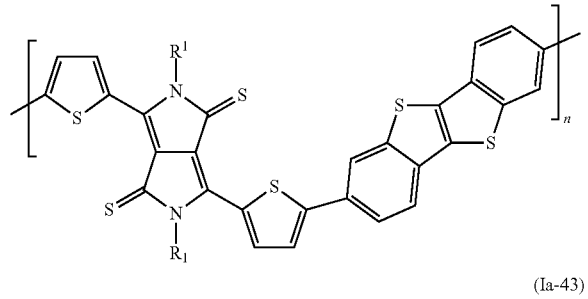

(Ia-43)
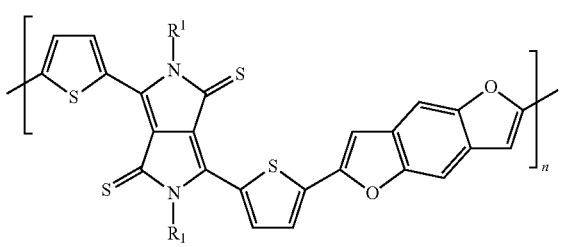

(Ia-44)
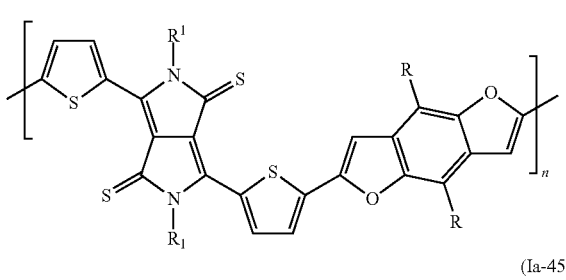

(Ia-45)
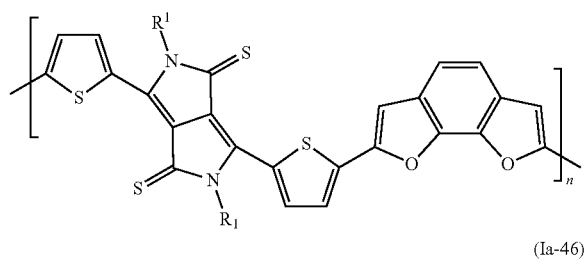

(Ia-46)
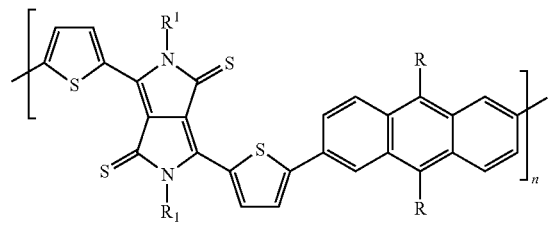

14

In one embodiment, the compound has formula Ia-1:

(Ia-1)
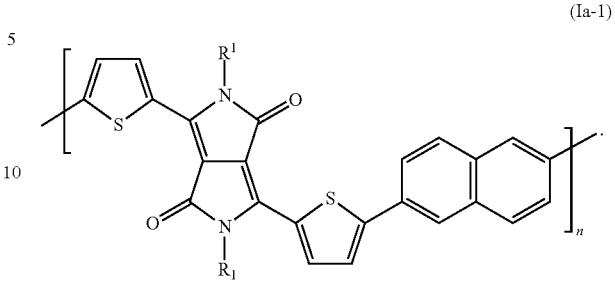

In another aspect, the invention provides a thin film comprising a compound of the invention.

The thin film may further comprise an electron acceptor material, which electron acceptor material may comprise PCMB in some embodiments.

In another aspect, the invention provides a device comprising a compound of any one of claims 1 to 4. The compound in the device may be in the form of a thin film of the invention.

In yet another aspect, the invention provides a device comprising an anode, a cathode and an electron donor material comprising a compound of the invention, the electron donor material disposed between the anode and the cathode.

The electron donor material may be in a photoactive layer, which may further comprise an electron acceptor material, for example PCMB.

The device may further comprise an additional layer disposed between the photoactive layer and the anode, or between the photoactive layer and the cathode.

In a further aspect, the invention provides a thin film transistor comprising a gate electrode separated from a source electrode and a drain electrode by a gate dielectric, and a semiconductor material in contact with the gate dielectric, the semiconductor material comprising a compound of the invention. The compound in the thin film transistor may be in the form of a thin film of the invention.

Other aspects and features of the present invention will become apparent to those of ordinary skill in the art upon review of the following description of specific embodiments of the invention in conjunction with the accompanying figures.

BRIEF DESCRIPTION OF THE DRAWINGS

In the figures, which illustrate, by way of example only, embodiments of the present invention.

DETAILED DESCRIPTION

Figure 1:
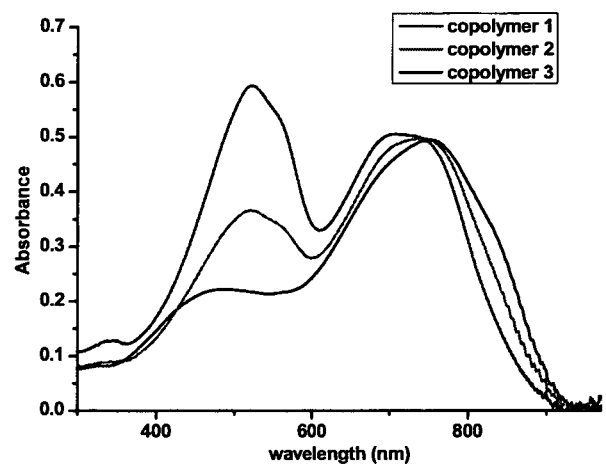
FIG. 1 is UV-vis spectra of solutions of compounds of the invention in chloroform.

Presented here are p-type semiconductor compounds that may be used as donor or hole transport materials, and organic devices incorporating such compounds. The compounds may be easily synthesized and may be solution processable. Accordingly, organic devices incorporating these compounds may be easily manufactured, including using solution-based techniques such as inkjet printing, dip and/or spin coating, and screen printing, to name a few.

The p-type compounds described herein contain DPP groups along the backbone as an electron-deficient building block. These groups exhibit strong electron withdrawing properties and good air stability. Additionally, inclusion of the DPP moieties may lower the HOMO energy levels, which may result in a higher $V_{oc}$ in OPV.

Rigid, fused aromatic or heteroaromatic electron-rich groups are also incorporated into the compound backbone. The fused aromatic or heteroaromatic groups selected are planar in nature and thus may adopt a coplanar arrangement with the DPP groups in the backbone. This coplanar conformation may facilitate molecular packing of the compounds, as well facilitate charge carrier transport along the backbone of the compound, thus making the compounds suitable for use in electronic devices including OPVs and OTFTs.

Thus, the compounds described herein contain DPP groups alternating with blocks of selected rigid, fused aromatic or heteroaromatic electron-rich groups, which may be separated with other groups such as arylene, heteroarylene or groups containing double or triple bonds.

An aromatic group is a cyclic group having 4n+2π electrons, where n is an integer equal to or greater then 0. As used herein, "aromatic" is used interchangeably with "aryl" to refer to an aromatic group, regardless of the valency of the aromatic group. Thus, aryl refers to monovalent aromatic groups, bivalent aromatic groups and higher multivalent aromatic groups. Any aromatic group may be optionally substituted.

A heteroaromatic group is an aromatic group containing one or more heteroatoms in the backbone, such as N, O, S, Se, Si or P, for example. As used herein, "heteroaromatic" is used interchangeably with "heteroaryl", and a heteroaryl group refers to monovalent aromatic groups, bivalent aromatic groups and higher multivalent aromatic groups containing one or more heteroatoms. Any heteroaromatic group may be optionally substituted.

It will be appreciated that an unsubstituted terminal aromatic or heteroaromatic group (also referred to as end-cap groups; i.e. at an end of a molecule that is formed from linking of multiple aromatic and/or heteroaromatic groups) will be monovalent and that an unsubstituted interior aromatic or heteroaromatic group (i.e. within a chain and not at an end of a molecule formed from linking of multiple aromatic and/or heteroaromatic groups) will be at least divalent.

As used herein when describing either electron-deficient (also referred to as electron withdrawing or accepting) or electron-rich (also referred to as electron donating) character of a particular aromatic or heteroaromatic group, such terms are used relative to the reference group of an unsubstituted phenyl group, either monovalent or divalent depending on whether the relevant group is a terminal group or falls within the backbone chain. Benzene is weakly electron donating, and thus electron donating aromatic or heteroaromatic groups described herein have equivalent or greater electron donating character as compared to a phenyl group. In contrast, electron withdrawing (electron accepting) aromatic or heteroaromatic groups described herein have less electron donating character as compared to a phenyl group. Thus, when a given aromatic or heteroaromatic group is conjugated to a phenyl group, if the pi electron cloud of the phenyl group moves toward the given aromatic or heteroaromatic group, the group is considered to be electron withdrawing; otherwise, the group is considered to be electron donating. Conventional methods and techniques can be used to determine whether a pi electron cloud of a phenyl group moves toward a given aromatic or heteroaromatic group, including electrophilic substitution reactions, or theoretical calculations of electron density.

The term "conjugated" as used herein in reference to the backbone of a molecule refers to a molecule having two or more double and/or triple bonds in the main chain of the molecule, each double or triple bond being separated from the next consecutive double or triple bond by a single bond so that π orbitals overlap not only across the double or triple bond, but also across adjacent single bonds located between adjacent double and/or triple bonds. The present compounds are composed of aromatic groups, heteroaromatic groups and/or a group containing two doubly or triply bonded atoms, each of these groups connected to the next by a single bond. Thus, the double or triple bonds along the backbone will be contributed by aromatic groups, heteroaromatic groups, and/or doubly or triply bonded groups (e.g. ethenylene groups or ethynylene groups) whereas some single bonds along the backbone will be contributed by aromatic or heteroaromatic groups and some single bonds will connect one aromatic, heteroaromatic group, or doubly or triply bonded group to the next.

It should be noted that for any list of possible elements or features provided in this specification, any subset falling within a given list is also intended.

Thus, the compounds have the general formula I:

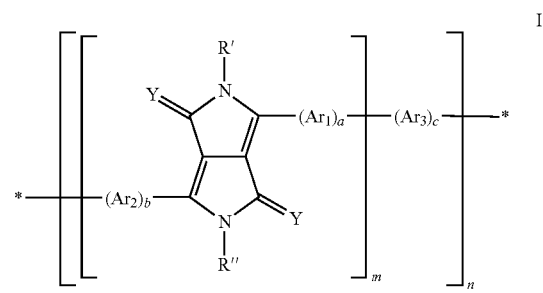

In formula I, Y is O, S or Se. In some embodiments, Y is O.

In formula I, each R' and R" is independently H or any hydrocarbon optionally containing one or more heteroatoms in the backbone, for example O, N, S, P or Si.

For example, in some embodiments, each R' and R" may independently be, for example, H; straight, branched or cyclic alkyl or heteroalkyl having from 1 to 50 backbone atoms; aryl or heteroaryl having from 5 to 50 backbone atoms; alkylaryl or alkylheteroaryl having from 6 to 50 backbone atoms; or arylalkyl or heteroarylalkyl having from 6 to 50 backbone atoms.

In some embodiments, each R' and R" is independently a straight alkyl or heteroalkyl group having from 2 to 50 backbone atoms.

In some embodiments, each R' and R" is independently a branched alkyl or branched heteroalkyl group having from 3 to 50 backbone atoms.

Each $Ar_1$ and each $Ar_2$ in formula I is independently arylene, heteroarylene, —CH═CH—, —C≡C—, —CH═N—, —N═N— or —N═P—, any of which may be optionally substituted where applicable. In some embodiments, each $Ar_1$ and each $Ar_2$ is independently an arylene having from 6 to 50 backbone carbons, a heteroarylene having from 5 to 50 backbone atoms, a —CH═CH—, a —C≡C—, a —CH═N—, a —N═N— or a —N═P— group, any of which may be optionally substituted where applicable. In some embodiments, each $Ar_1$ and each $Ar_2$ is a five-membered heteroaryl ring in which the heteroatom is O, S or Se. In some embodiments, each $Ar_1$ and $Ar_2$ is

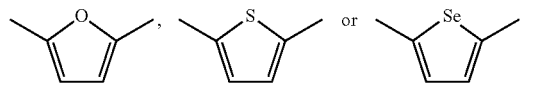

Each a and each b is independently an integer from 0 to 20; each c and each m is independently an integer from 1 to 20; and n is an integer from 2 to 5000.

Each $Ar_3$ is independently one of the following groups:

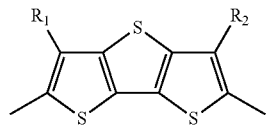
A1

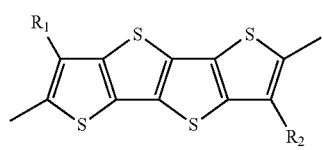
A2

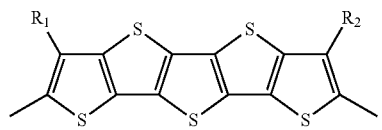
A3

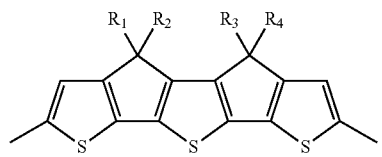
A4

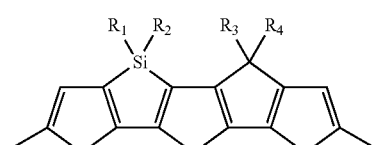
A5

-continued

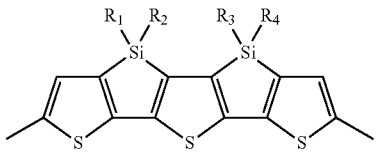
A6

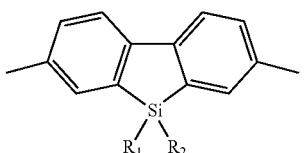
A7

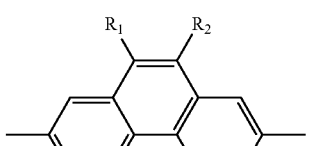
A8

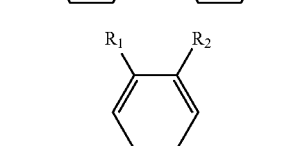
A9

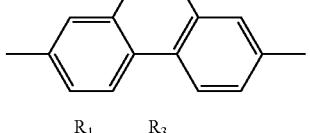
A10

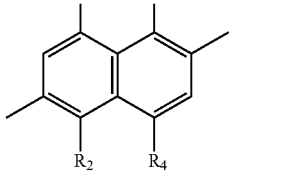
A11

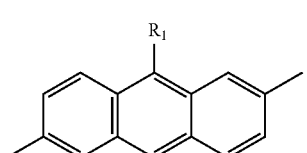
A12

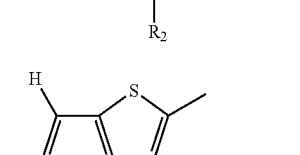
A13

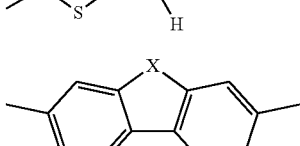
A14

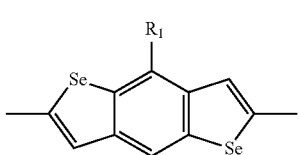

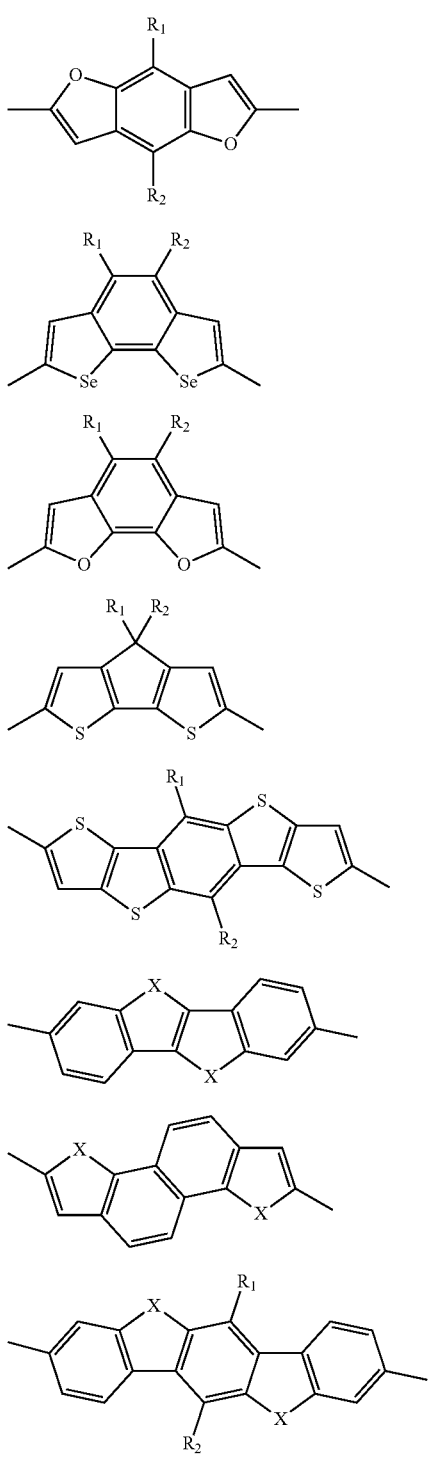

In each of the above the above Ar₃ groups, each of R₁, R₂, R₃ and R₄ is a hydrogen; straight or branched alkyl or heteroalkyl having from 1 to 20 backbone atoms; or aryl or heteroaryl having from 5 to 40 backbone atoms, any of which may be optionally substituted with one or more F, Cl, CN, CO₂H, SO₃H or NO₂ groups. X is O, S or Se.

Although the above list for various Ar₃ groups is provided, it is intended that in certain embodiments, each Ar₃ may be independently chosen from any subset of the above list.

In some embodiments any Ar₃ may be A1. In some embodiments, any Ar₃ may be A2. In some embodiments, any Ar₃ may be A3. In some embodiments, any Ar₃ may be A4. In some embodiments, any Ar₃ may be A5. In some embodiments, any Ar₃ may be A6. In some embodiments, any Ar₃ may be A7. In some embodiments, any Ar₃ may be A8. In some embodiments, any Ar₃ may be A9. In some embodiments, any Ar₃ may be A10. In some embodiments, any Ar₃ may be A11. In some embodiments, any Ar₃ may be A12. In some embodiments, any Ar₃ may be A13. In some embodiments, any Ar₃ may be A14. In some embodiments, any Ar₃ may be A15. In some embodiments, any Ar₃ may be A16. In some embodiments, any Ar₃ may be A17. In some embodiments, any Ar₃ may be A18. In some embodiments, any Ar₃ may be A19. In some embodiments, any Ar₃ may be A20. In some embodiments, any Ar₃ may be A21. In some embodiments, any Ar₃ may be A22.

It will be appreciated that any of the above Ar₃ groups may be substituted at any suitable position with one or more straight or branched alkyl or heteroalkyl having from 1 to 20 backbone atoms, or aryl or heteroaryl having from 5 to 40 backbone atoms, any of which may be optionally substituted with one or more F, Cl, CN, CO₂H, SO₃H or NO₂ groups.

It will be appreciated that the values for a, b, m and c may vary within a given compound for each repeating unit of n repeating units.

In some embodiments, in general formula I, a, b, c and m are each 1 and Ar₁ and Ar₂ are each independently

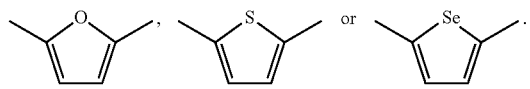

Thus, in some embodiments, the compound has a general formula Ia:

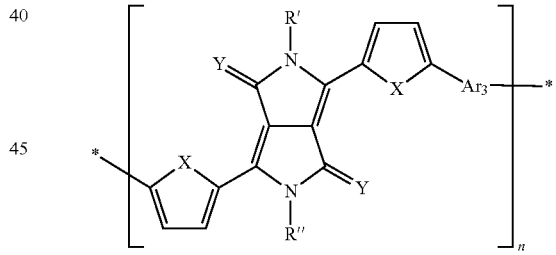

In general formula Ia, X, Y and n are as defined above.

In general formula Ia, each R' and R" is independently a straight alkyl, branched alkyl, or branched heteroalkyl group having from 1 to 50 backbone atoms.

In general formula Ia, each Ar₃ is independently selected from A1 to A22 as set out above.

In some embodiments any Ar₃ may be A1. In some embodiments, any Ar₃ may be A2. In some embodiments, any Ar₃ may be A3. In some embodiments, any Ar₃ may be A4. In some embodiments, any Ar₃ may be A5. In some embodiments, any Ar₃ may be A6. In some embodiments, any Ar₃ may be A7. In some embodiments, any Ar₃ may be A8. In some embodiments, any Ar₃ may be A9. In some embodiments, any Ar₃ may be A10. In some embodiments, any Ar₃ may be A11. In some embodiments, any Ar₃ may be A12. In some embodiments, any Ar₃ may be A13. In some embodiments, any Ar₃ may be A14. In some embodiments, any Ar₃ may be A15. In some embodiments, any Ar₃ may be A16. In some embodiments, any Ar₃ may be A17. In some embodiments, any Ar₃ may be A18. In some embodiments, any Ar₃ may be A19. In some embodiments, any Ar₃ may be A20. In some embodiments, any Ar₃ may be A21. In some embodiments, any Ar₃ may be A22.

In various embodiments, compounds of formula Ia include the following compounds (Ia-1) to (Ia-46) as set out below.

(Ia-1)
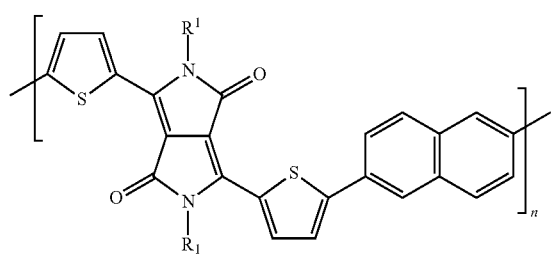

(Ia-2)
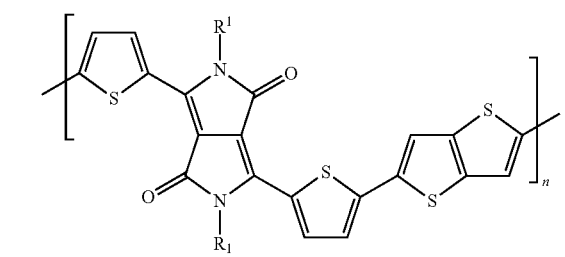

(Ia-3)
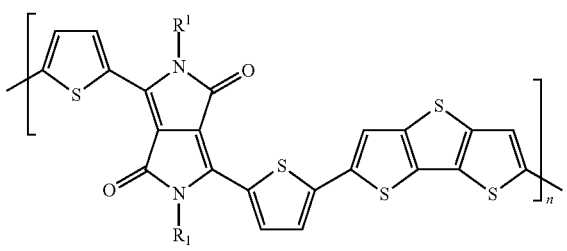

(Ia-4)
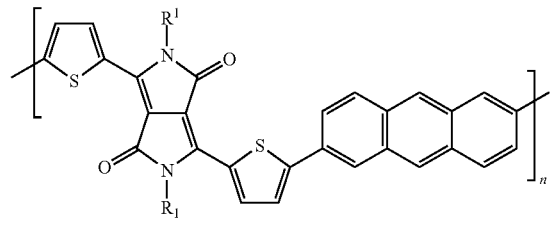

(Ia-5)

(Ia-6)
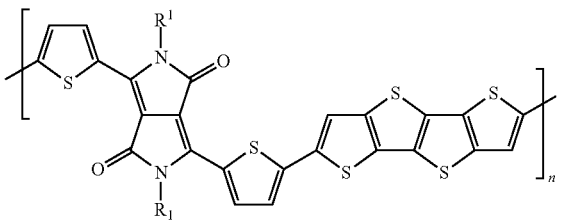

(Ia-7)
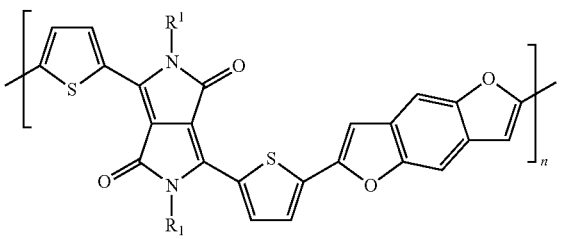

(Ia-8)
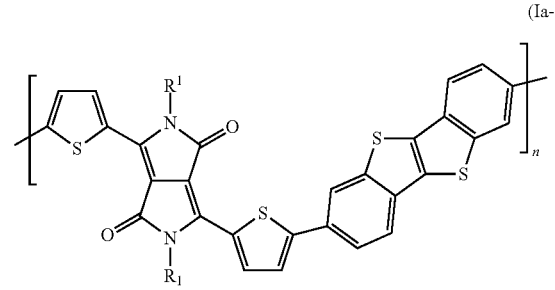

(Ia-9)
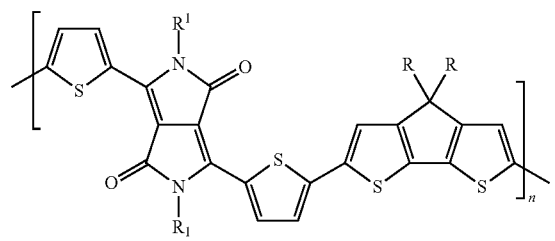

(Ia-10)
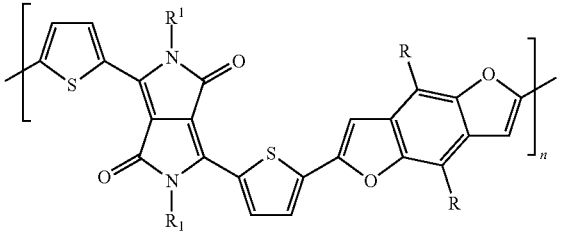

(Ia-11)
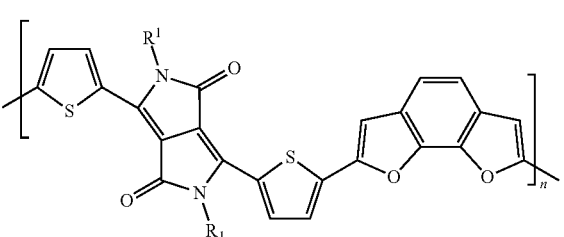

(Ia-12)
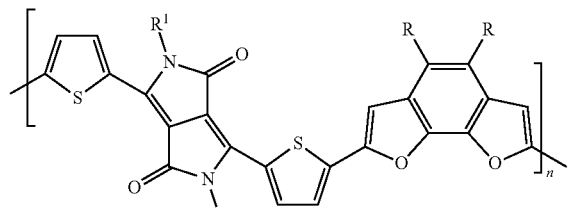
(Ia-13)
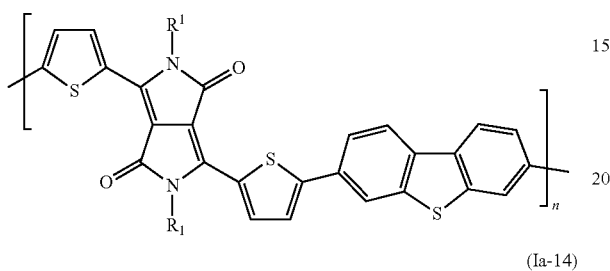
(Ia-14)
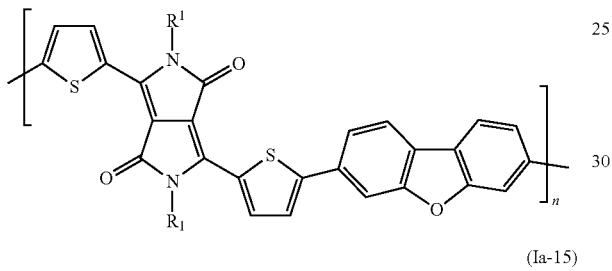
(Ia-15)
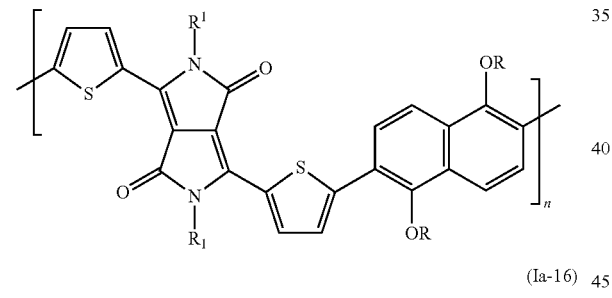
(Ia-16)
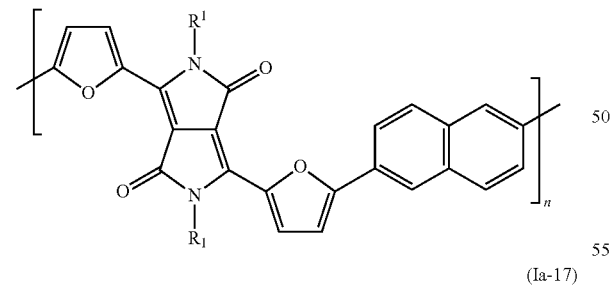
(Ia-17)
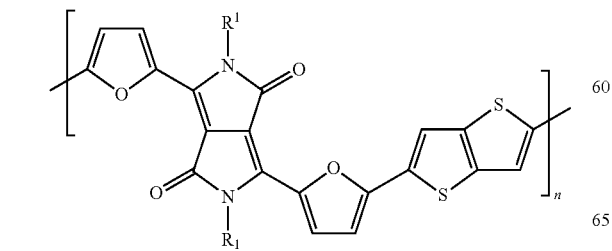
(Ia-18)
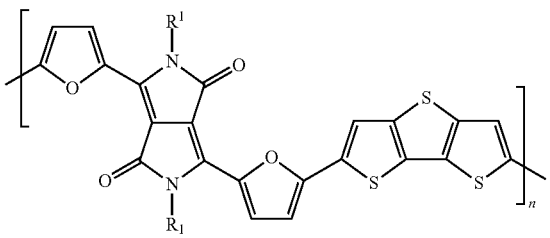
(Ia-19)
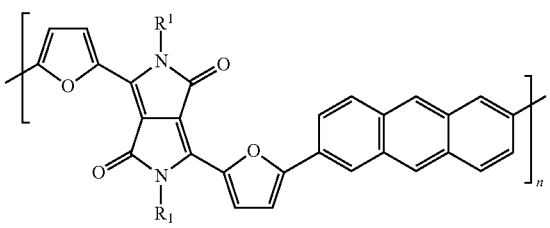
(Ia-20)
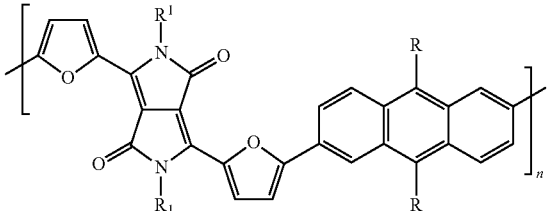
(Ia-21)
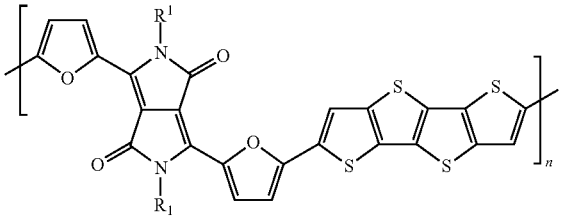
(Ia-22)
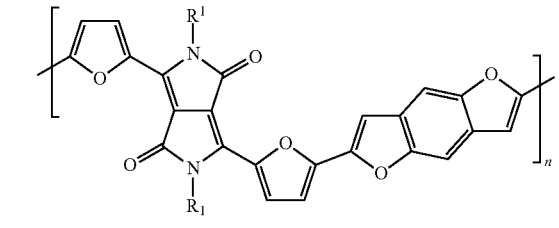
(Ia-23)
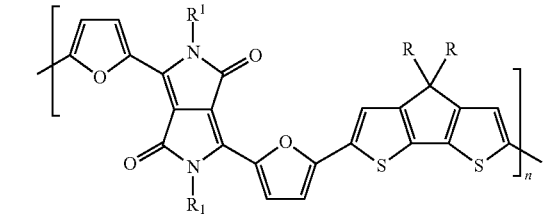

(Ia-24)
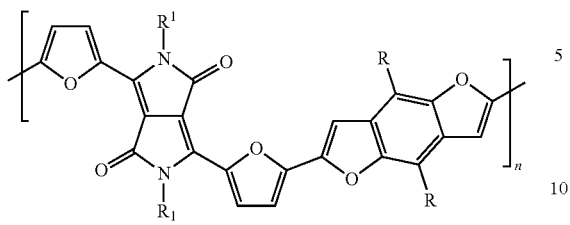
(Ia-25)
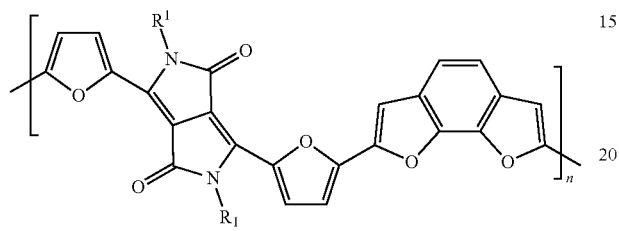
(Ia-26)
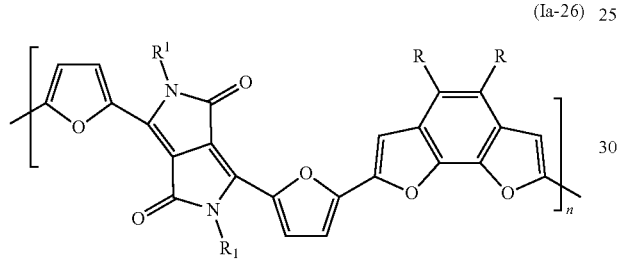
(Ia-27)
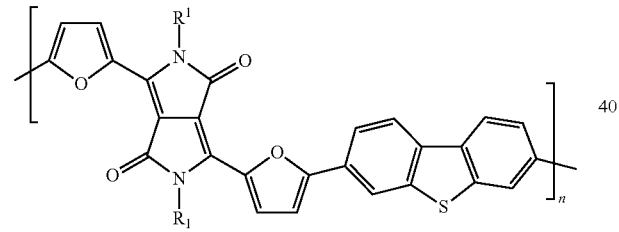
(Ia-28)
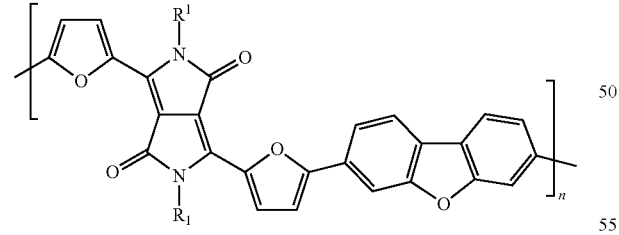
(Ia-29)
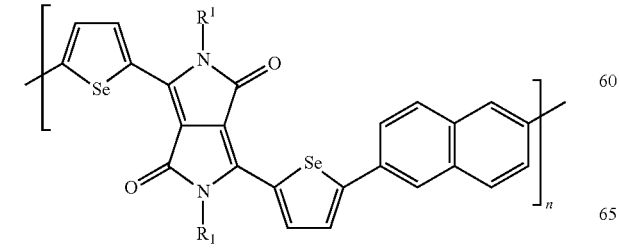
(Ia-30)
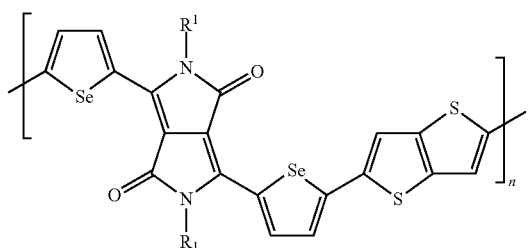
(Ia-31)
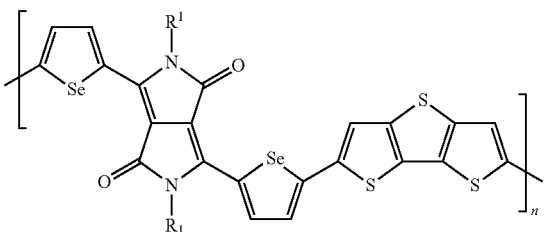
(Ia-32)
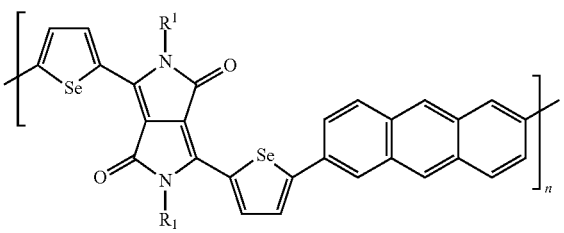
(Ia-33)
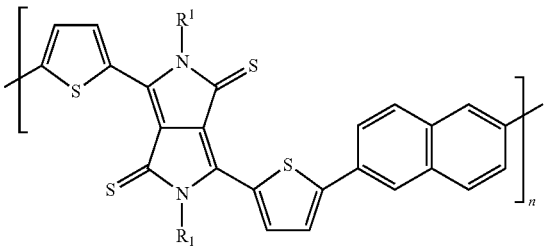
(Ia-34)
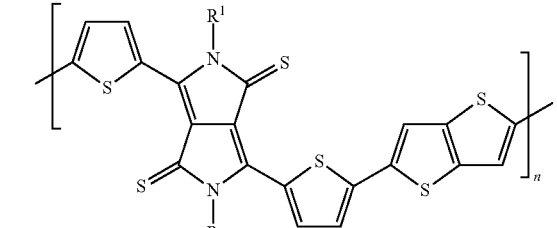

(Ia-36)
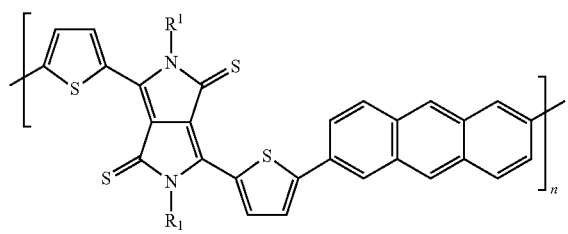

(Ia-37)
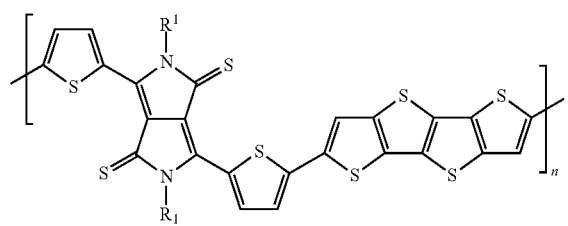

(Ia-38)
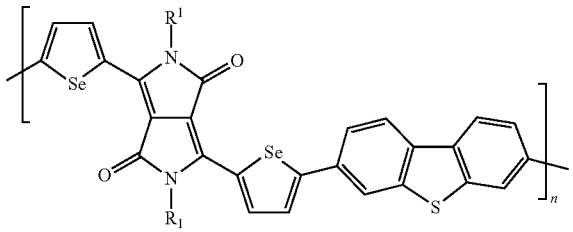

(Ia-39)
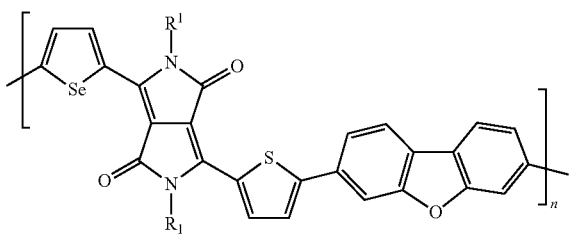

(Ia-40)
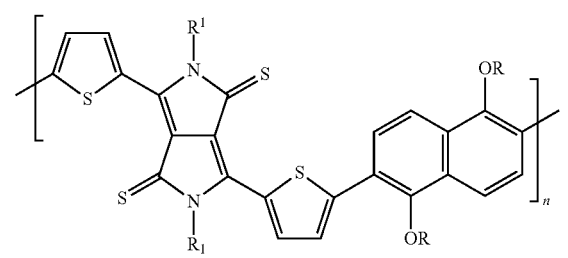

(Ia-41)
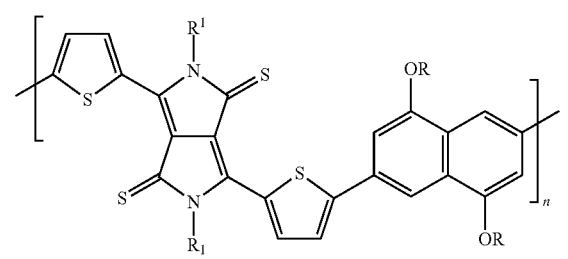

(Ia-42)
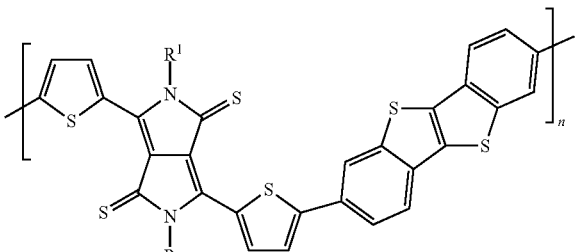

(Ia-43)
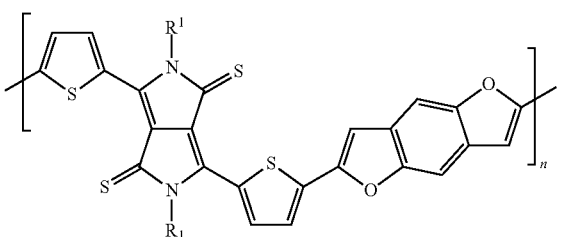

(Ia-44)
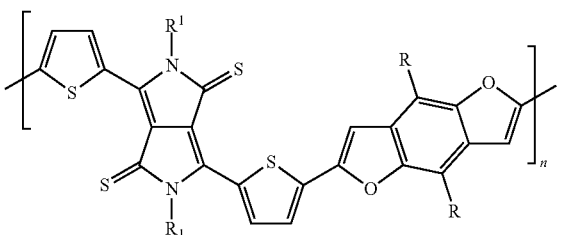

(Ia-45)
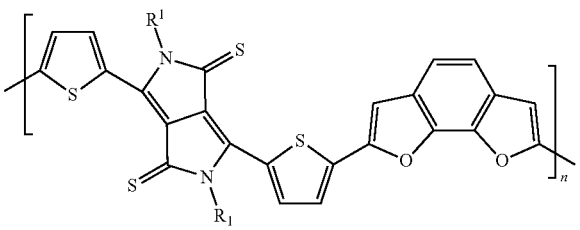

(Ia-46)
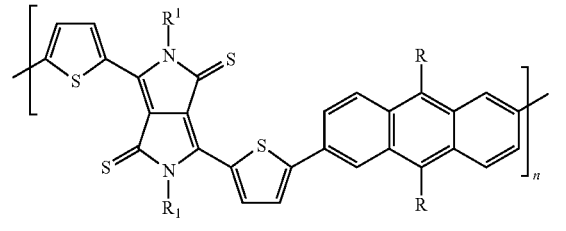

In the above compounds Ia-1 to Ia-46, each of R and $R_1$ is independently a straight or branched alkyl or heteroalkyl having from 1 to 40 backbone atoms, or aryl or heteroaryl having from 5 to 40 backbone atoms, any of which may be optionally substituted with one or more F, Cl, CN, $CO_2H$, $SO_3H$ or $NO_2$ groups. n is an integer of from about 2 to about 5000.

In one embodiment, the compound of formula Ia is Ia-1. In another embodiment, the compound of formula Ia is Ia-2. In another embodiment, the compound of formula Ia is Ia-3. In another embodiment, the compound of formula Ia is Ia-4. In another embodiment, the compound of formula Ia is Ia-5. In another embodiment, the compound of formula Ia is Ia-6. In another embodiment, the compound of formula Ia is Ia-7. In another embodiment, the compound of formula Ia is Ia-8. In another embodiment, the compound of formula Ia is Ia-9. In another embodiment, the compound of formula Ia is Ia-10. In another embodiment, the compound of formula Ia is Ia-11. In another embodiment, the compound of formula Ia is Ia-12. In another embodiment, the compound of formula Ia is Ia-13. In another embodiment, the compound of formula Ia is Ia-14. In another embodiment, the compound of formula Ia is Ia-15. In another embodiment, the compound of formula Ia is Ia-16. In another embodiment, the compound of formula Ia is Ia-17. In another embodiment, the compound of formula Ia is Ia-18. In another embodiment, the compound of formula Ia is Ia-19. In another embodiment, the compound of formula Ia is Ia-20. In another embodiment, the compound of formula Ia is Ia-21. In another embodiment, the compound of formula Ia is Ia-22. In another embodiment, the compound of formula Ia is Ia-23. In another embodiment, the compound of formula Ia is Ia-24. In another embodiment, the compound of formula Ia is Ia-25. In another embodiment, the compound of formula Ia is Ia-26. In another embodiment, the compound of formula Ia is Ia-27. In another embodiment, the compound of formula Ia is Ia-28. In another embodiment, the compound of formula Ia is Ia-29. In another embodiment, the compound of formula Ia is Ia-30. In another embodiment, the compound of formula Ia is Ia-31. In another embodiment, the compound of formula Ia is Ia-32. In another embodiment, the compound of formula Ia is Ia-33. In another embodiment, the compound of formula Ia is Ia-34. In another embodiment, the compound of formula Ia is Ia-35. In another embodiment, the compound of formula Ia is Ia-36. In another embodiment, the compound of formula Ia is Ia-37. In another embodiment, the compound of formula Ia is Ia-38. In another embodiment, the compound of formula Ia is Ia-39. In another embodiment, the compound of formula Ia is Ia-40. In another embodiment, the compound of formula Ia is Ia-41. In another embodiment, the compound of formula Ia is Ia-42. In another embodiment, the compound of formula Ia is Ia-43. In another embodiment, the compound of formula Ia is Ia-44. In another embodiment, the compound of formula Ia is Ia-45. In another embodiment, the compound of formula Ia is Ia-46.

The compounds of formula I can be synthesized using routine chemical techniques, including via the Suzuki coupling reaction, the Stille coupling reaction, the Heck coupling reaction, the Wittig-Horner reaction, the Knoevenagel condensation reaction or the Sonogashira reaction, or via reduction polymerization, oxidation polymerization or condensation polymerization.

By combining a five-membered heteroaryl-substituted DPP unit with an electron donating fused electron rich aromatic or heteroaromatic group in formula Ia, high coplanarity of the polymer backbone may be achieved and intermolecular pi-pi interaction and pi-pi overlapping may be increased, which may lead to improved hole transport along the backbone of compounds of formula Ia. As stated above, the electron-withdrawing DPP may lower the HOMO energy level of the polymer and provide good oxidative stability. Introduction of branched hydrocarbon side chains may contribute to good solubility and solution processability properties of the compounds.

The feed ratio of the various monomers, including the DPP monomer and the fused electron-rich $Ar_3$ group, may be varied when polymerizing the monomers to form the compounds of formula I. The molar ratio of DPP monomers to $Ar_3$ monomers may vary from 1:20 to 20:1, from 1:10 to 10:1, from 1:5 to 5:1 or from 1:3 to 3:1. In some embodiments, the ratio of DPP to Ar3 may be from 1:2 to 2:1. In some embodiments, the ratio of DPP to Ar3 may be about 1:1.

Particular reaction schemes to synthesize compounds of formula I, including formula Ia are set out in the Examples below, in Schemes 1 to 4, which reaction schemes may be adapted for synthesis of other compounds within formula I.

The compounds of formula I may exhibit high solubility and may be easily purified using standard techniques including column chromatography, repeated precipitation from poor solvents, and/or Soxhlet extraction. Thus, the compounds of formula I may be obtained with high purity.

The bandgap (the difference between the HOMO and the LUMO energy levels) and the absorption range for compounds of formula I can be tuned at least in part by varying the DPP group, the $Ar_3$ group and the ratio between the two, based on considerations such as the particular energy levels of any acceptor material that may be used in an electronic device in which the compounds of formula I are to be used as donor material.

The tunability of the compounds, along with the ease in synthesis and purification, can make the compounds of formula I useful for general application as donor p-type material. For example, the compounds of formula I may be used as light harvesting and hole transporting materials in organic photovoltaic (OPV) cells or as hole transporting material in OTFTs.

As indicated above, the values for a, b, c and m in formula I may vary. Varying the ratio of DPP to $Ar_3$ in compounds of formula I allows for the tuning of the charge transporting property of any particular compound falling within formula I. As well, by varying the ratio of DPP to $Ar_3$, it is possible to adjust the absorption spectra of a compound in order to achieve a broadened absorption band. A broader absorption band may result in improved light absorption efficiency when the compound is used in electronic devices such as OPV devices.

In addition, the combination of the DPP groups and the selected fused electron-rich groups for $Ar_3$ in formula I may provide improved molecular packing of the compound when included in a thin film, which may contribute to high hole mobility of the compound when included in an electronic device such as OPV and OTFT devices.

The p-type compounds of formula I thus may be suitable for use as low bandgap donor materials, and may exhibit a bandgap between 1.1 to 1.9 eV, preferably 1.4 to 1.6 eV, thus allowing for harvesting of light in the longer wavelength region. The compounds may be designed to have the following desirable properties: (i) expanded absorption spectra to cover both short wavelength region and long wavelength region in order to maximize the light absorption efficiency; and (ii) facilitation of molecular packing to achieve high mobility donor material thus being suitable in the manufacture of high $J_{sc}$ and high FF OPV devices.

The power conversion efficiency of OPVs is determined by short circuit current density ($J_{sc}$), open circuit voltage ($V_{oc}$), and fill factor (FF). Very generally, the $V_{oc}$ is governed by the energy levels of the donor and acceptor materials used. The $J_{sc}$ depends on the photon absorption of the active layer. When calculating the increase in current generated by narrowing the bandgap of the donor, it should be taken into account that not all photons with higher energy than the bandgap of the donor material are absorbed. For most of low bandgap polymers, light absorption in the longer wavelength range is enhanced. However, the absorption at short wavelength side is weakened. Thus, to enhance the light absorption in an OPV, the use of the low bandgap compounds of formula I that are designed to have a broad absorption band may increase light absorption and thus increase photocurrent.

Fill factor will also affect the PCE of an OPV. The fill factor of a device depends at least in part on the charge dissociation, the charge carrier transport, and the recombination processes. A good hole transport capability is important for proper device operation. When hole and electron transport are unbalanced, a build up of space charge results in a square root dependence of the photocurrent on voltage, resulting in low fill factors. Charge transporting property is mainly determined by the intrinsic charge mobility of the donor/acceptor material used, as well as on the morphology. Formation of an interpenetrating network of a donor material with an acceptor material requires the donor to have a certain interaction with the acceptor, preventing severe phase separation. Also, the donor material should exhibit some degree of structural ordering, such as that demonstrated by the compounds of formula I. Such structural ordering enhances the transport properties such as the hole mobility, thereby reducing the limitation of a space charge limited photocurrent.

Since low bandgap donor materials may increase the total amount of photons harvested from the solar spectrum, such materials can have great potential use in polymeric solar cells. However, narrowing of the polymeric bandgap may decrease the open circuit voltage ($V_{oc}$), which is governed by the energy levels of donor and acceptor. This may thus eventually result in a decrease in power conversion efficiency.

Thus, the compounds of formula I may exhibit the following features that make them useful in electronic devices: (i) high field effect mobility; (ii) high hole mobility without annealing, which is especially attractive for roll-to-roll manufacturing printed organic electronics; (iii) good solubility in common organic solvents at room temperature, which allows facile printing; and (iv) good air stability, which allows for solution processing under ambient conditions.

The compounds of formula I are suitable for solution processing, thus allowing for production of a thin film containing such a compound, for inclusion in an organic electronic device. Thus, there is presently provided a thin film comprising a compound of formula I.

The thin film is a layer comprising a compound of formula I as described above, which may be formed to be in the order of from about 1 to about 1000 nm thick, from about 1 to about 500 nm thick, from about 5 to about 300 nm thick.

When used in a solar cell, the thin film may constitute the photoactive layer of the solar cell, and thus may further comprise a suitable n-type electron acceptor material.

For example, the acceptor material may comprise [6,6]-phenyl-C61-butyric acid methyl ester (PCMB), [6,6]-phenyl-C71-butyric acid methyl ester ($PC_{71}BM$), 2-vinyl-4,5-dicyanoimidazoles, or a perylene tetracarboxylic diimide. In one embodiment, the acceptor material is PCMB.

The thin film may be formed on a suitable substrate, which may be any solid substrate, including indium tin oxide (ITO) coated glass or plastic, fluorine tin oxide (FTO) coated glass or plastic, quartz, glass, mica, a plastic substrate such as polyethylene terephthalate or polycarbonate, paper, metal, or silicon. The thin film may also be layered onto another layer when forming a multilayered device, or onto an electrode.

To form the thin film, the compound of formula (I) and any additional film components may be dissolved in a suitable organic solvent. Suitable solvents include dichloromethance, trichloroethane, chloroform, hexane, heptanes, octane, toluene, ethylbenzene, xylene, ethyl benzoate, methyl benzoate, 1,1,2,2-tetrachloroethane, THF, dioxane, chlorobenzene, dichlorobenzenes, trichlorobenzene, mesitylene and mixtures of the aforesaid solvents.

The thin film may be formed on a suitable surface using standard deposition or coating methods including solution coating. Solution coating includes spin coating, casting, microgravure coating, gravure coating, bar coating, roll coating, wire bar coating, dip coating, spray coating, screen printing, flexo printing, micro-contact printing, offset printing, blade coating and inkjet printing.

The compounds of formula (I) and thin films containing such compounds may form the semiconductor material or charge transport material in an organic electronic device, including an organic thin film transistor. Such devices are known in the art. As well, the compounds of formula (I) and thin films containing such compounds may be used to construct solar cells and OTFTs. The compounds of formula (I) and thin films containing such compounds may be used as the electron donor in the photoactive layer in an organic photovoltaic cell and/or as the p-channel material in an OTFT. Such devices and layers are known in the art.

Thus, there is presently provided a device comprising a compound of formula (I) or a thin film comprising a compound of formula (I).

Figure 3:
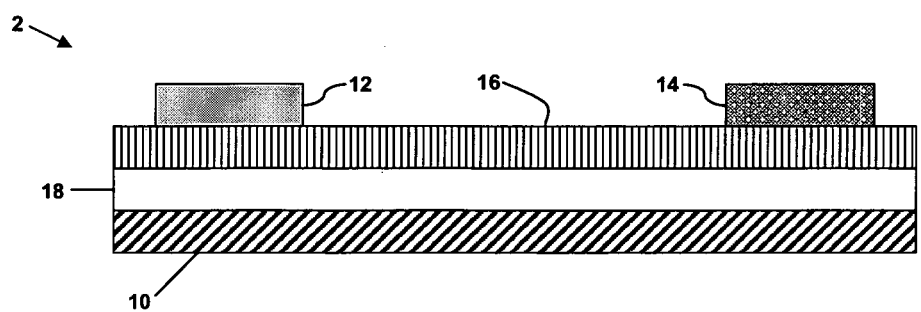
FIG. 3 is a schematic diagram of an organic thin film transistor device using a compound of the invention.

In one embodiment, with reference to FIG. 3, the device 2 comprises a bottom gate, top contact thin film transistor. The device comprises a gate electrode 10, a source electrode 12, and a drain electrode 14. The gate electrode 10 is separated from the source electrode 12 and drain electrode 14 by a gate dielectric 18. A semiconductor material 16 comprising a compound of formula I, for example in the form of a thin film, is in contact with the gate dielectric 18 and forms a conductive path between source electrode 12 and drain electrode 14.

The semiconductor material 16 may have a thickness of from about 5 nm to about 5 μm, including any intermediate value or range.

The gate electrode 10 may comprise any conductive material such as, for example, a doped silicon, for example $p^+$ or $n^+$ doped silicon, a metal such as aluminium, copper, silver, gold, nickel, or iron, a conductive oxide such as indium-tin oxide (ITO) or fluorine tin oxide, a conductive polymer such as poly(3,4-ethylenedioxythiophene):polystyrenesulfonate (PEDOT:PSS) or polyaniline. The gate electrode 10 may have a thickness of from about 20 nm to about 2 mm.

The gate dielectric 18 may be, for example, silicon dioxide, or a polymer such as polymethylmethacrylate (PMMA), or polystyrene, which may be optionally modified with a self-assembling monolayer of a reactive organosilane, for example comprising octyltrichlorosilane.

The source 12 and drain 14 electrodes may be made of any suitable conductive material, and may be the same or different material. In some embodiments, source electrode 12 and drain electrode 14 are made from the same metal, for example gold.

The above-mentioned devices may be prepared by layering the relevant layers on top of one another. The layers may be prepared by methods known in the art, including solution coating techniques mentioned above. Solution coating steps may be carried out in an inert atmosphere, such as, for example, under nitrogen gas. Alternatively, some layers may be prepared by thermal evaporation or by vacuum deposition. Metallic layers may be prepared by known techniques, such as, for example, thermal or electron-beam evaporation, chemical-vapour deposition or sputtering, or printing conductive meal particle inks. Layers may be annealed at a temperature of from about 20° C. to about 250° C.

Figure 5:
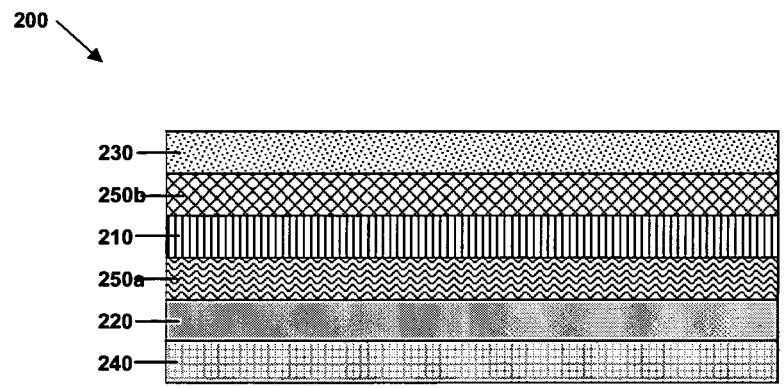
FIG. 5 is a schematic depiction of an organic photovoltaic device that includes a compound of the invention.

In one embodiment, with reference to FIG. 5, device 200 comprises a photoactive layer 210 comprising a compound of formula (I) as an electron acceptor. The photoactive layer 210 further includes an electron donor, as described above.

Active layer 210 is deposited between cathode 230 and anode 220. In certain embodiments, photoactive layer 210 is from about 5 to about 100 nm thick.

The anode 220 is any material capable of conducting holes and injecting them into organic layers. Anode 220 may be gold, silver, fluorine tin oxide (FTO) or indium tin oxide (ITO), or conductive polymer layers. The anode 220 may be reflective, transparent, semi-transparent or translucent. In certain embodiments, the anode is transparent material such as ITO.

Cathode 230 is any material capable of conducting electrons and injecting them into organic layers. Cathode 230 may be a low work function metal or metal alloy, including, for example, barium, calcium, magnesium, indium, aluminum, ytterbium, silver, a calcium:silver alloy, an aluminum:lithium alloy, or a magnesium:silver alloy, such as, for example an alloy wherein the atomic ratio of magnesium to silver is about 10:1 (U.S. Pat. No. 6,791,129) or an alloy where the atomic ratio of lithium to aluminum is about 0.1: 100 to about 0.3:100 (Kim et al. (2002) Curr. Appl. Phys. 2(4):335-338; Cha et al (2004) Synth. Met. 143(1): 97; Kim et al (2004) Synth. Met. 145(2-3): 229). The cathode 230 may be a single layer or have a compound structure. Cathode 230 may comprise layers of lithium fluoride, aluminium and silver. The cathode 230 may be reflective, transparent, semi-transparent or translucent.

In certain embodiments, one or more of the anode and the cathode may be deposited on a support 240, which may be transparent, semi-transparent or translucent. Support 240 may be rigid, for example quartz or glass, or may be a flexible polymeric substrate. Examples of flexible transparent semi-transparent or translucent substrates include, but are not limited to, polyimides, polytetrafluoroethylenes, polyethylene terephthalates, polyolefins such as polypropylene and polyethylene, polyamides, polyacrylonitrile and polyacrionitrile, polymethacrylonitrile, polystyrenes, polyvinyl chloride, and fluorinated polymers such as polytetrafluoroethylene.

The device may optionally comprise an additional layer 250 between the photoactive layer 210 and the anode 220 (250a), the cathode 230 (250b) or both. The layer 250 may be a poly(ethylene dioxytiophene)/polystyrene sulfonic acid (PEDOT:PSS) layer or Ca. The layer 250 may be from about 5 nm to about 100 nm.

In a particular embodiment, device 200 comprises the following layers: glass/ITO/PEDOT:PSS/active layer/Ca/Ag, in which the photoactive layer is formed from a ratio of compound of formula I:PCMB ranging from 5:1 to 1:5 weight ratio of compound of formula I:PCMB.

The above-mentioned devices may be prepared by laying the relevant layers on top of one another. The layers may be prepared by methods known in the art, including solution coating techniques mentioned above. Solution coating steps may be carried out in an inert atmosphere, such as, for example, under nitrogen gas. Alternatively, some layers may be prepared by thermal evaporation or by vacuum deposition. Metallic layers may be prepared by known techniques, such as, for example, thermal or electron-beam evaporation, chemical-vapour deposition or sputtering, or printing conductive metal particle inks.

The solar cells have been described above with a thin film comprising the electron donor material and electron acceptor material. However, it will be appreciated that the present compounds can be used to form devices in which the p-type electron donor material is in a separate layer from the n-type electron acceptor material.

The solar cell devices described herein may be used in stacked solar cells, in which two or more solar cells are stacked in a single device, for example as described in published patent application US 20070090371.

The following examples are intended as exemplary only and are not in any way intended to limit the scope of the present invention.

EXAMPLES

Instruments $^1$H and $^{13}$C NMR data were performed on a Bruker DPX 400 MHz spectrometer with chemical shifts referenced to CDCl$_3$. Matrix assisted laser desorption/ionization time-of-flight (MALDI-TOF) mass spectra were obtained on a Bruker Autoflex TOF/TOF instrument using dithranol as a matrix and silver trifluoroacetate as an ionizing salt when necessary. Differential scanning calorimetry (DSC) was carried out under nitrogen on a DSC Q100 instrument (scanning rate of 10° C.min$^{-1}$). Thermal gravimetric analysis (TGA) was carried out using TGA Q500 instrument (heating rate of 10° C.min$^{-1}$). Cyclic voltammetry experiments were performed using an Autolab potentiostat (model PGSTAT30) by Echochimie. All CV measurements were recorded in dichloromethane with 0.1 M tetrabutylammonium hexafluorophosphate as supporting electrolyte (scan rate of 100 mV·s$^{-1}$). The experiments were performed at room temperature with a conventional three electrode configuration consisting of a platinum wire working electrode, a gold counter electrode, and a Ag/AgCl in 3 M KCl reference electrode. The measured potentials were converted to SCE (saturated calomel electrode) and the corresponding ionization potential (IP) and electron affinity (EA) values were derived from the onset redox potentials, based on −4.4 eV as the SCE energy level relative to vacuum (EA=$E_{red-onset}$+4.4 eV, IP=$E_{ox-onset}$+4.4 eV). UV-Vis spectra were recorded on a Shimadzu model 2501-PC UV-VIS spectrometer, and photoluminescence (PL) spectra were measured on a Perkin-Elmer (LS50B) spectrofluorimeter.

Example 1

Synthesis of Compound 1 (DD-DPP)

Compound 1 was synthesized as set out in Scheme 1 below.

The starting precursor compound, 5-dihydro-1,4-dioxo-3,6-dithienylpyrrolo[3,4-c]-pyrrole (DPP) was synthesized in good yield following a previously reported procedure which involves reaction of 2-thiophenecarbonitrile with 0.5 eq of di-n-butyl succinate ester and an excess of potassium t-butoxide using 2-methyl-2-butanol as solvent. To prepare soluble derivative 3,6-bis-[2,2']bithiophenyl-5-yl-2,5-di-n-dodecylpyrrolo[3,4-c]pyrrole-1,4-dione (DD-DPP), further alkylation of DPP was performed using 3 equivalents of n-dodecylbromide with 3 eqivalents of anhydrous K$_2$CO$_3$ in presence of anhydrous DMF solvent. Alkylated DPP was additionally dibrominated with N-bromosuccinimide in anhydrous chloroform and crude compound was purified by column chromatography using chloroform as eluent and the overall yield was recorded around 40%. $^1$H NMR (CDCl$_3$): d 0.88 (t, 6H), 1.18-1.47 (m, 36H), 1.75 (m, 4H), 4.09 (t, 4H), 7.29 (d, 2H), 7.65 (d, 4H), 8.94 (d, 2H).

Scheme 1

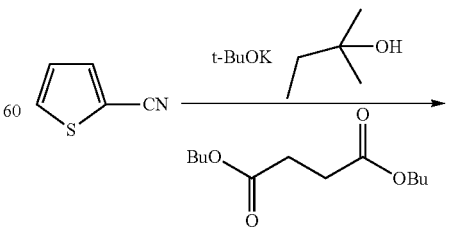

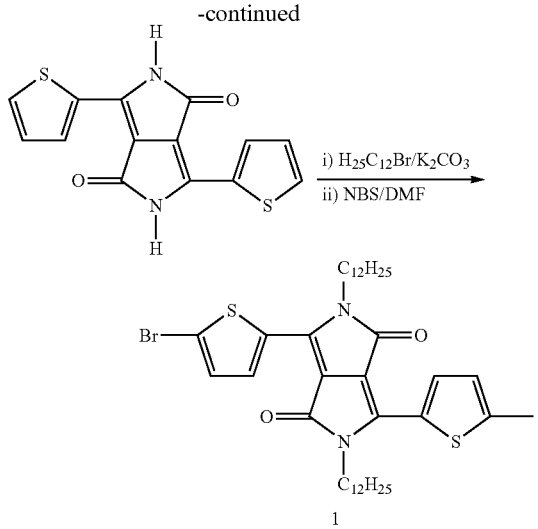

Example 2

Synthesis of Compounds 2 to 8

Compounds 2 to 8 were synthesized as set out in Scheme 2 below.

Yiliang Wu, Ping Liu, Maria Birau, Hualong Pan, and Beng S. Ong, *Adv. Mater.* 2006, 18, 3029-3032].

Synthesis of 1-(3-bromo-6-pentadecyl-thieno[3,2-b]thiophen-2-yl)-pentadecan-1-ol (3): Lithium diisopropylamide solution (15 mL, 0.03 mol, 2M in tetrahydrofuran) was added dropwise to a solution of 6-bromo-3-pentadecylthieno[3,2-b]thiophene (10.8 g, 0.025 mol) and THF (150 mL) in ice-water bath and kept stirring for 2 hrs, then the reaction was quenched by hexadecyl aldehyde (6 g, 0.025 mol). The mixture was stirred overnight and quenched with water. After evaporating most of THF, 150 mL methylene chloride was added and mixture was washed with brine (2×100 mL), water (100 mL) and dried over anhydrous MgSO4. The product was obtained by column chromatography on silica gel, eluting with 2% ethyl acetate in hexane (14.5 g, 86% yield).

Synthesis of 1-(3-bromo-6pentadecyl-thieno[3,2-b]thiophen-2-yl)-pentadecan-1-one (4): 4.5 grams of sodium dichromate dihydrate (0.015 mol) was dissolved in the mixture of 6 g concentrated sulfuric acid and 60 mL water, this chromic acid solution was added dropwise at room temperature into the solution of compound 3 (13.2 g, 0.02 mol) in acetone (300 mL) and stirred overnight. After evaporating off most of the acetone, 200 mL water was added, and the solid was collected by filtration. The product was obtained by column chromatography on silica gel, eluting with 12% methylene chloride in hexane (8.4 g, 63% yield).

Synthesis of 3,5-dipentadecyl-dithieno[3,2-b;2',3'-d]thiophene-2-carboxylic acid ethyl ester (5): ethyl thioglyco- Scheme 2

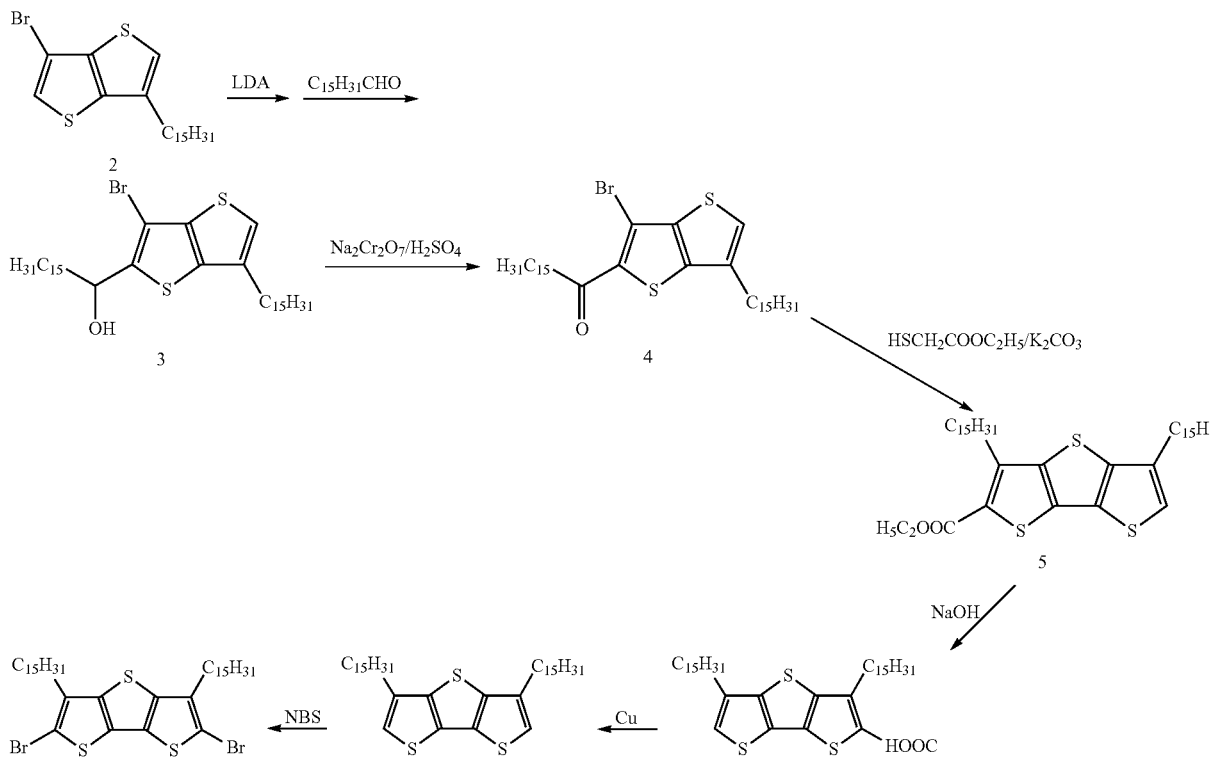

3-Bromo-6-pentadecyl-thieno[3,2-b]thiophene (2) was prepared according to the published procedure [Yuning Li, late (0.85 g, 0.77 mL, 7 mmol) was added to a mixture of 4 (4.5 g, 6.74 mmol), $K_2CO_3$ (1.86 g, 13.5 mmol), and N,N- dimethylformamide (DMF) (70 mL) at room temperature. The resulting mixture was stirred for 12 hrs at room temperature and another 12 hrs at 50° C. The mixture was then poured into an aqueous sodium chloride solution (100 mL) and extracted with ethyl acetate (150 mL). The organic layer was separated, washed with saturated aqueous sodium chloride solution (4×150 mL), and dried over MgSO4. The crude product was obtained after evaporating off the solvent and used in the next step without further purification (4.2 g, 91% yield).

Synthesis of 3,5-dipentadecyl-dithieno[3,2-b;2',3'-d]thiophene-2-carboxylic acid (6): A mixture of 5 (4.2 g, 6.1 mmol) and NaOH (0.49 g, 12.2 mmol) in EtOH (80 mL) was refluxed for 6 h. The mixture was poured into water (400 mL). The pH was adjusted to 1 with aqueous 10 M HCl solution. The precipitated solid was collected by filtration and dried under vacuum. The crude product was used for the next step without any purification (3.9 g, 98% yield).

Synthesis of 3,5-dipentadecyl-dithieno[3,2-b;2',3'-d]thiophene (7): Compound 6 (3.9 g, 6 mmol), copper powder (0.24 g, 3.6 mmol) and quinoline (50 mL) were heated at 250-260° C. When no further bubbles of carbon dioxide gas could be detected (about 20 mins), the mixture was cooled to room temperature and hexane (200 mL) was added to the quinoline mixture. This mixture was washed repeatedly with HCl (1-2 M solution). The organic layer was dried over anhydrous MgSO$_4$ and solvent was removed. Compound 6 was obtained after silica gel chromatography eluting with hexane (2.37 g, 64%).

2,6-dibromo-3,5-dipentadecyl-dithieno[3,2-b;2',3'-d]thiophene (8): The solution of N-Bromosuccinimide (1.43 g, 8 mmol) in DMF (10 mL) was added dropwise into a well-stirred solution of 7 (2.35 g, 3.8 mmol) in methylene chloride (40 mL) at room temperature. The mixture was stirred for 5 hrs and poured into 80 mL water, then extracted with methylene chloride (3×60 mL). The organic solution was combined and evaporated. The solid was dissolved in hexane and passed through a short silica gel column using hexane as an eluent. Recrystallization from ethanol provided white product. (2.8 g, 95% yield).

Example 3

Synthesis of Copolymers 1, 2, 3

Copolymers 1, 2, 3 were synthesized as set out in Scheme 3.

Scheme 3

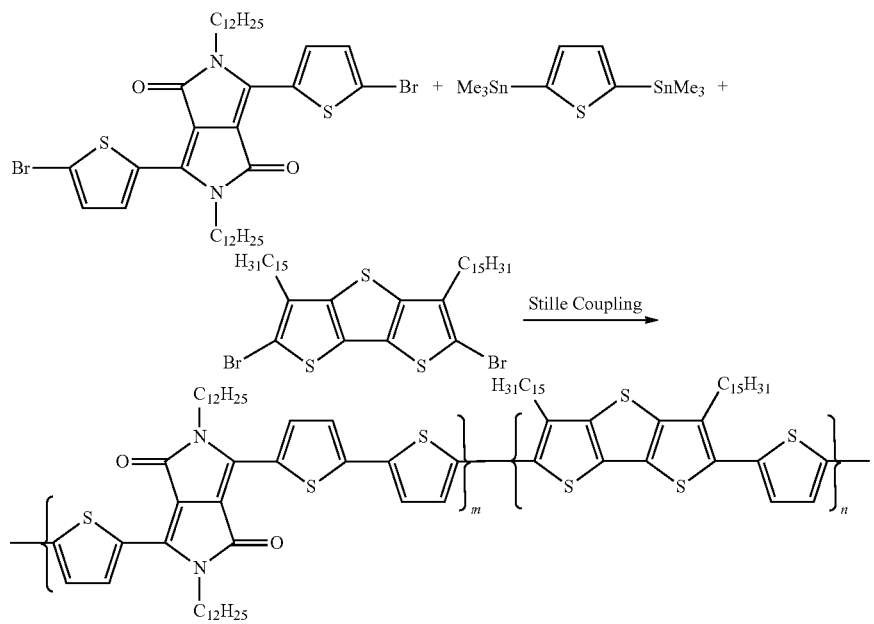

Synthesis of Copolymer 1 (m/n=1/1): To a Schlenk flask was added 2,5-Bis(trimethylstannanyl)thiophene (2 equivalent, 65.2 mg, 0.16 mmol), 2,6-dibromo-3,5-dipentadecyl-dithieno[3,2-b;2',3'-d]thiophene (1 equivalent, 61.6 mg, 0.08 mmol), compound 1 (1 equivalent, 63 mg, 0.08 mmol), tri(o-toyl) phosphine (16 mol % equivalent, 3.87 mg, 0.0128 mmol), tris(dibenzylideneacetone)dipalladium (4 mol % equivalent, 2.9 mg, 0.0032 mmol) and dry chlorobenzene (30 ml) under the protection of nitrogen. The flask was securely sealed and stirred for 72 h at 120° C. After cooling to room temperature, the reaction mixture was precipitated into a mixture of methanol (100 ml) and concentrated hydrochloric acid (4 ml) and stirred for 16 h. The precipitate was collected, Soxhlet extracted with ethanol and hexane for 48 h each, and dried under vacuum afford the bulk product (90 mg, 75% yield).

Synthesis of Copolymer 2 (m/n=1/2): To a Schlenk flask was added 2,5-Bis(trimethylstannanyl)thiophene (3 equivalent, 77.6 mg, 0.189 mmol), 2,6-dibromo-3,5-dipentadecyl-dithieno[3,2-b;2',3'-d]thiophene (1 equivalent, 97.8 mg, 0.126 mmol), compound 1 (1 equivalent, 50 mg, 0.063 mmol), tri(o-toyl) phosphine (16 mol % equivalent, 4.6 mg, 0.0151 mmol), tris(dibenzylideneacetone)dipalladium (6 mol % equivalent, 3.5 mg, 0.0038 mmol) and dry chlorobenzene (30 ml) under the protection of nitrogen. The flask was securely sealed and stirred for 72 h at 120° C. After cooling to room temperature, the reaction mixture was precipitated into a mixture of methanol (100 ml) and concentrated hydrochloric acid (4 ml) and stirred for 16 h. The precipitate was collected, Soxhlet extracted with ethanol and hexane for 48 h each, and dried under vacuum afford the bulk product (128 mg, 94% yield).

Synthesis of Copolymer 3 (m/n=1/3): To a Schlenk flask was added 2,5-Bis(trimethylstannanyl)thiophene (4 equivalent, 103.4 mg, 0.252 mmol), 2,6-dibromo-3,5-dipentadecyl-dithieno[3,2-b;2',3'-d]thiophene (1 equivalent, 146.7 mg, 0.189 mmol), compound 1 (1 equivalent, 50 mg, 0.063 mmol), tri(o-toyl) phosphine (32 mol % equivalent, 6.13 mg, 0.02 mmol), tris(dibenzylideneacetone)dipalladium (8 mol % equivalent, 4.6 mg, 0.005 mmol) and dry chlorobenzene (30 ml) under the protection of nitrogen. The flask was securely sealed and stirred for 72 h at 120° C. After cooling to room temperature, the reaction mixture was precipitated into a mixture of methanol (100 ml) and concentrated hydrochloric acid (4 ml) and stirred for 16 h. The precipitate was collected, Soxhlet extracted with ethanol and hexane for 48 h each, and dried under vacuum afford the bulk product (170 mg, 95% yield).

Example 4

Characterization of Copolymers 1, 2, 3

Copolymers 1, 2, 3 demonstrated good thermal stability with decomposition (95% weight loss) temperatures around 420° C.

UV absorption spectra measurement of the solution samples of the copolymers dissolved in chloroform demonstrated a two absorption band profile (FIG. 1). One band covered from 600 to 900 nm and the other covered from 400 to 600 nm. The absorption band is broader than other p-type polymers, e.g. P3HT. When the ratio of DPP monomer and monomer of 2,6-dibromo-3,5-dipentadecyl-dithieno[3,2-b; 2',3'-d]thiophene was changed from 1:1 to 1:2 then 1:3, the absorbance of the short wavelength band increase relative to the absorbance of the long wavelength band. This result indicates that the absorption spectrum profile can be tuned through controlling the feed ratio of the comonomers.

Figure 2:
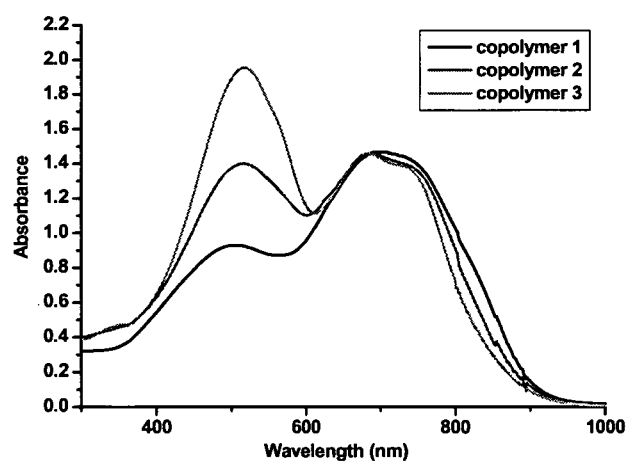
FIG. 2 is UV-vis spectra of thin films of compounds of the invention.

As can be seen in FIG. 2, the UV spectra of thin film samples reassembly the spectrum of solution sample. The absorbance of the short wavelength band was seen to be enhanced slightly in the thin film.

Example 5

OTFT Device with Copolymer 3

Top contact bottom gate Organic Thin Film Transistors (OTFT) shown in FIG. 3 were fabricated using following steps.

p+—Si (or n+—Si)/$SiO_2$ substrates (where p+—Si (or n+—Si) and $SiO_2$ work as gate contact and gate dielectric, respectively) were subjected to routine cleaning using ultrasonication in Acetone, Methanol and de-ionized water, dried under flow of nitrogen and then treated with UV-ozone for 20 minutes. The substrate surface was modified with octyltricholorosilane (OTS) by immersion in a solution of OTS in toluene overnight, then thoroughly rinsed with isopropanol and dried under flow of nitrogen gas. The organic thin film was spin-coated on the top of substrate by using 0.4% copolymer 3 dissolved in dichlorobenzene. Then the top contact bottom gate OTFTs were fabricated by depositing ~100 nm of gold as source and drain contacts using shadow masks. The OTFT devices have 60 μm channel length (L) in combination to 5 mm channel width (W).

Figure 4:
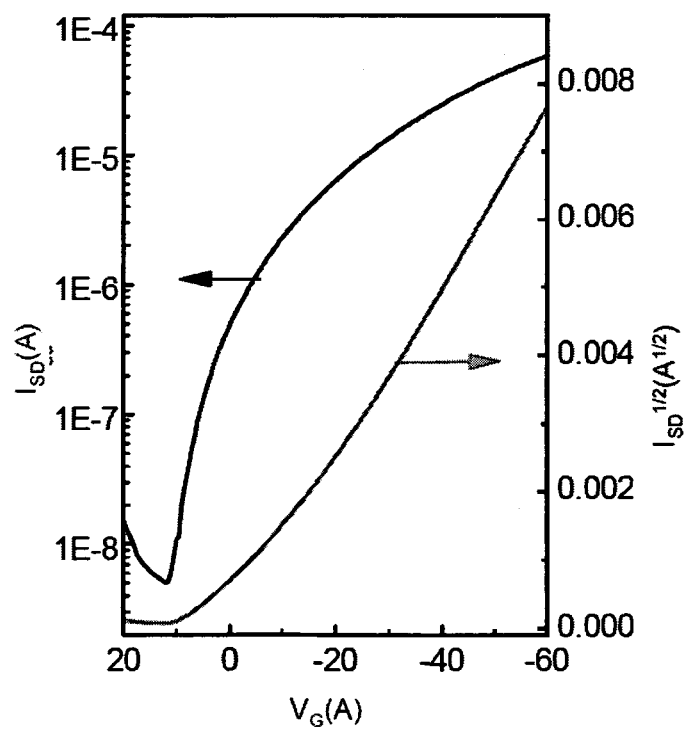
FIG. 4 depicts a mobility measurement graph for an OTFT device using a compound of the invention.

Copolymer 3 based OTFTs have shown p-type charge transport exhibiting saturation hole mobility ~0.03-0.04 $cm^2/V \cdot s$ with $I_{on}/I_{off}$=1.2×10$^4$ after annealed at 160° C. for 30 min, as shown in FIG. 4.

Example 6

Synthesis of OPV Containing Copolymers 1, 2, 3

Each of copolymer 1, 2, and 3 were dissolved with PCBM in dichlorobenzene (weight ratio=1:1, 1:2, 1:4 and 1:5) at a total concentration of 10 mg/ml. Patterned ITO-coated glass were used as substrates (with 160 nm of ITO and an average sheet resistance of 14Ω/□). The ITO/glass substrates were cleaned in detergent (30 min), distilled water (10 min, 2 times), acetone (15 mins) and isopropanol (20 min). The substrates were then baked at 100° C. to remove residual solvents. The dried substrates were subjected to oxygen plasma cleaning for 10 min prior to spin coating a 40 nm of poly(3,4-ethylenedioxythiophene) poly(styrenesulfonate) (PEDOT:PSS) hole transporting layer. Subsequently, copolymer:PCBM blends were spun coat on top of PEDOT:PSS layer with a spinning speed of 1500 rpm for 60 seconds in inert gas glove box. The metal cathode layer (Ca/Ag) was next evaporated through a shadow mask at a pressure of 8×10$^{-5}$ Pa to obtain devices with an active area of 9 $mm^2$. The performances of the organic solar cells were characterized under simulated AM1.5G solar irradiation with a power intensity of 100 $mW/cm^2$. A schematic of the OPV device is shown in FIG. 5.

Figure 6:
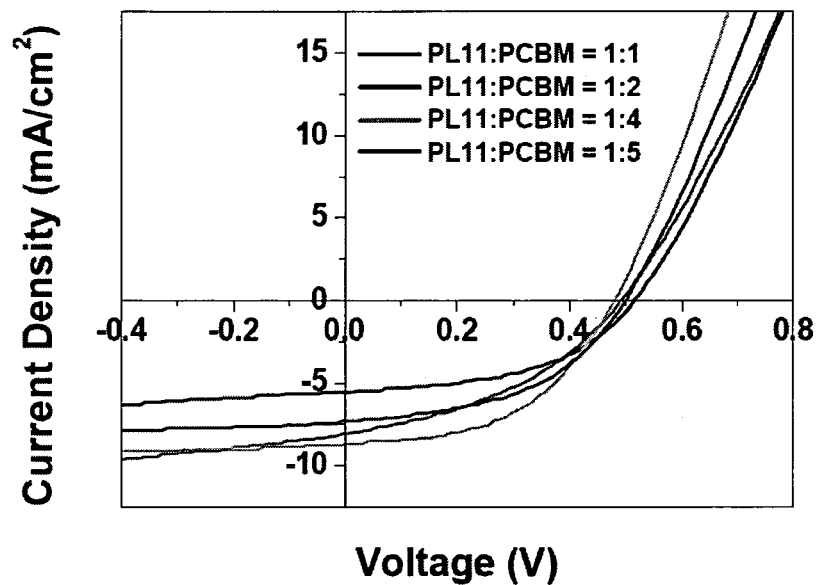
FIG. 6 is I-V plots of OPV devices containing copolymer1: PCMB as the active layer.
Figure 7:
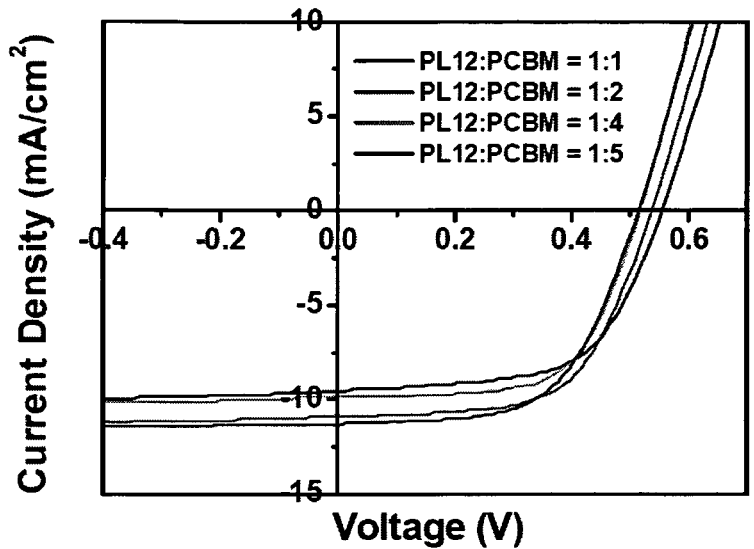
FIG. 7 is I-V plots of OPV devices containing copolymer2: PCMB as the active layer.
Figure 8:
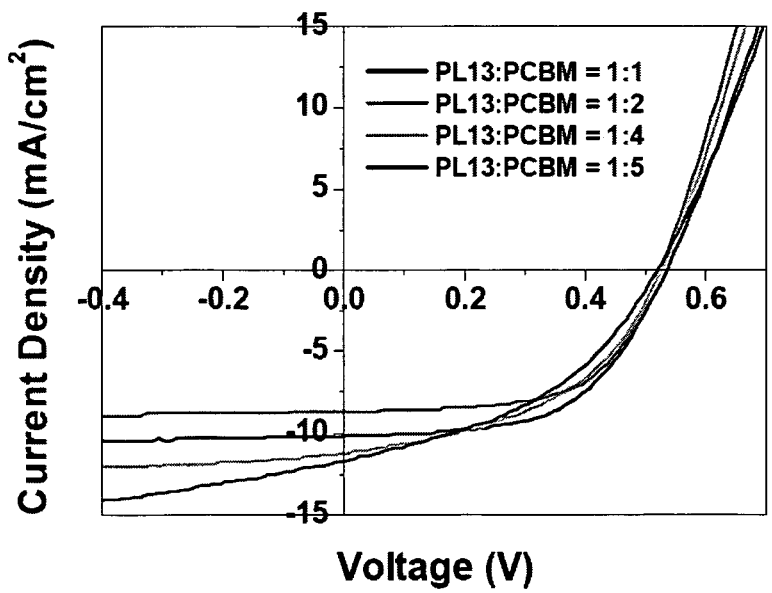
FIG. 8 is I-V plots of OPV devices containing copolymer3: PCMB as the active layer.

The characterization data for devices are shown in Tables 1, 2 and 3 and the current-voltage (I-V) characteristics of the OPV device are illustrated in FIGS. 6, 7, and 8. The ratio of 1:2 for the copolymer 2:PCBM blend gives the best PCE of 3.58%.

TABLE 1

OPV devices fabricated with Copolymer 1

| Polymer:PCBM | $V_{OC}$ (V) | $J_{SC}$ (mA/cm$^2$) | Fill factor (%) | PCE (%) |
|---|---|---|---|---|
| 1:1 | 0.52 | 5.54 | 48.93 | 1.40 |
| 1:2 | 0.49 | 8.10 | 39.83 | 1.59 |
| 1:4 | 0.48 | 8.71 | 49.33 | 2.06 |
| 1:5 | 0.50 | 7.35 | 47.58 | 1.75 |

TABLE 2

OPV devices fabricated with Copolymer 2

| Polymer:PCBM | $V_{OC}$ (V) | $J_{SC}$ (mA/cm$^2$) | Fill factor (%) | PCE (%) |
|---|---|---|---|---|
| 1:1 | 0.55 | 9.55 | 60.55 | 3.20 |
| 1:2 | 0.54 | 10.93 | 61.00 | 3.58 |
| 1:4 | 0.52 | 9.90 | 63.22 | 3.24 |
| 1:5 | 0.51 | 11.28 | 59.25 | 3.44 |

TABLE 3

OPV devices fabricated with Copolymer 3

| Polymer: PCBM | $V_{OC}$ (V) | $J_{SC}$ (mA/cm$^2$) | Fill factor (%) | PCE (%) |
|---|---|---|---|---|
| 1:1 | 0.54 | 10.17 | 56.21 | 3.06 |
| 1:2 | 0.52 | 8.67 | 60.96 | 2.77 |
| 1:4 | 0.53 | 11.24 | 46.52 | 2.75 |
| 1:5 | 0.52 | 11.69 | 41.81 | 2.54 |

OPV device with configuration of ITO/PEDOT:PSS/Copolymer 2:PCBM (1:1)/Ca/Ag was fabricated. The $V_{oc}$, $J_{sc}$, and fill factor and PCE for the device were measured to be 0.55 V, 9.55 mA/cm$^2$, 60.55% respectively. The power conversion efficiency PCE is 3.20%.

OPV device with configuration of ITO/PEDOT:PSS/Copolymer 2:PCBM (1:2)/Ca/Ag was fabricated. The $V_{oc}$, $J_{sc}$, and fill factor and PCE for the device were measured to be 0.54 V, 10.93 mA/cm$^2$, 61.00% respectively. The power conversion efficiency PCE is 3.58%.

OPV device with configuration of ITO/PEDOT:PSS/Copolymer 2:PCBM (1:4)/Ca/Ag was fabricated. The $V_{oc}$, $J_{sc}$, and fill factor and PCE for the device were measured to be 0.52 V, 9.90 mA/cm$^2$, 63.22% respectively. The power conversion efficiency PCE is 3.24%.

OPV device with configuration of ITO/PEDOT:PSS/Copolymer 2:PCBM (1:5)/Ca/Ag was fabricated. The $V_{oc}$, $J_{sc}$, and fill factor and PCE for the device were measured to be 0.51 V, 11.28 mA/cm$^2$, 59.25% respectively. The power conversion efficiency PCE is 3.44%.

Copolymer 2 and PC$_{71}$BM were dissolved in dichlorobenzene (weight ratio=1:2) at a total concentration of 10 mg/ml. Patterned ITO-coated glass were used as substrates (with 160 nm of ITO and an average sheet resistance of 14Ω/□). The ITO/glass substrates were cleaned in detergent (30 min), distilled water (10 min, 2 times), acetone (15 mins) and isopropanol (20 min). The substrates were then baked at 100° C. to remove residual solvents. The dried substrates were subjected to oxygen plasma cleaning for 10 min prior to spin coating a 40 nm of poly(3,4-ethylenedioxythiophene) poly(styrenesulfonate) (PEDOT:PSS) hole transporting layer. Subsequently, copolymer 2:PC$_{71}$BM blends were spun coat on top of PEDOT:PSS layer with a spinning speed of 1500 rpm for 60 seconds in inert gas glove box. The metal cathode layer (Ca/Ag) was next evaporated through a shadow mask at a pressure of 8×10$^{-5}$ Pa to obtain devices with an active area of 9 mm$^2$. The performances of the organic solar cells were characterized under simulated AM1.5G solar irradiation with a power intensity of 100 mW/cm$^2$. The characterization data for the device showed $V_{oc}$ of 0.50 V, $J_{sc}$ of 12.91 mA/cm$^2$, fill factor of 58.49% and PCE of 3.81%.

Example 7

PDPP-OD-Np

Polymer PDPP-OD-Np was synthesized according Scheme 4, as set out below.

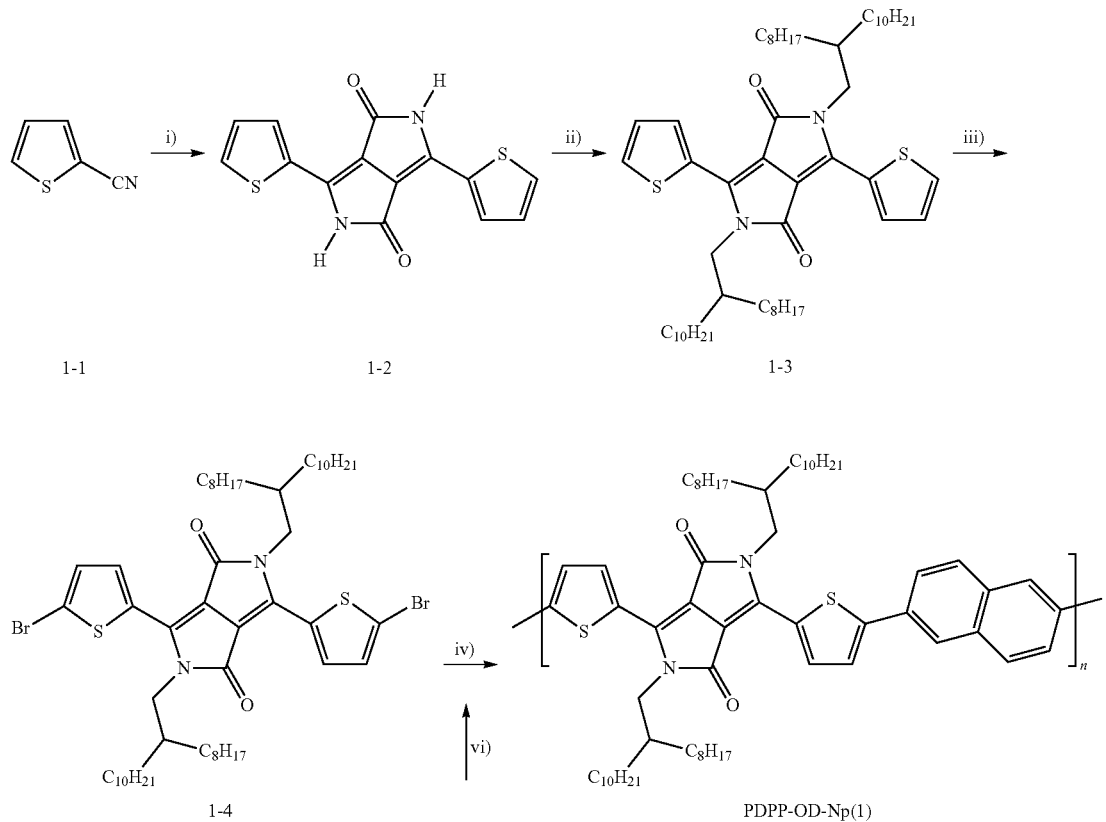

Scheme 4

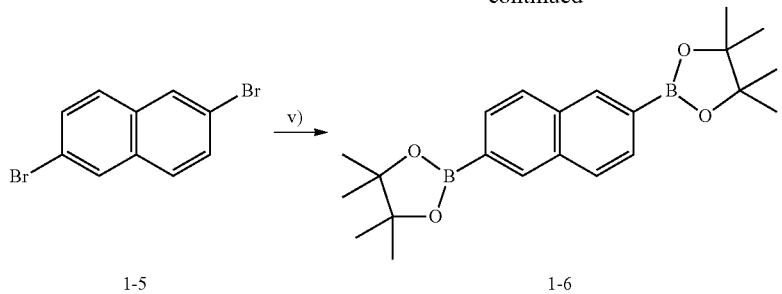

1-5    1-6

In Scheme 4, the following synthesis reaction steps were performed: i) diisopropylsuccinate/t-$C_5H_{11}$OK/2-methyl-2-butanol/120° C.; ii) 2-octyl-1-dodecyl bromide/$K_2CO_3$/DMF/130° C.; iii) NBS/chloroform; v) Pd(dppf)$Cl_2$/KOAc/1,4-dioxane; vi) Pd(PPh$_3$)$_4$/Aliquat 336/2M $K_2CO_3$/toluene.

Synthesis of 2,5-dihydro-1,4-dioxo-3,6-dithienylpyrrolo[3,4-c]-pyrrole (1-2): Fine pieces of sodium metal (6.90 g, 0.30 mol) were added to 100 mL t-amyl alcohol and a small amount of iron (iii) chloride (100 mg) was added. The mixture was stirred vigorously for 2 hr at 105° C. until sodium disappeared. The solution was cooled at 85° C. 2-Thiophenecarbonitrile (22.0 g, 0.2 mol) was added to the resultant solution. Then diisopropyl succinate (16.6 g, 0.08 mol) was dissolved in 10 mL of t-amyl alcohol and added drop wise over 1 hr at 85° C. Reaction was stirred at this temperature for 12 hrs. The reaction mixture was then cooled to 50° C., diluted with 100 mL of methanol, and then slowly neutralized with 30 ml of glacial acetic acid and refluxed briefly, and the reaction mixture was filtered. After the residue was washed several times with hot methanol and water, the resultant solid was dried in vacuum oven at 50° C. A dark red colored powder was obtained which was used further without purification (20 g, 83%).

Synthesis of N,N'-bis(octyldodecyl)-3,6-dithienyl-1,4-diketopyrrolo[3,4-c]pyrrole (1-3): In a three neck oven dried 250 ml round bottom flask, 2,5-dihydro-1,4-dioxo-3,6-dithienylpyrrolo[3,4-c]-pyrrole (2), (7.0 g. 23.30 mmol) and anhydrous $K_2CO_3$ (8.95 g, 69.91 mmol) were dissolved in 250 ml of anhydrous N,N-dimethylformamide (DMF), and heated to 120° C. under argon for 1 h. 2-octyl-1-dodecylbromide (25.27 g, 69.91 mmol) was then added drop wise, and the reaction mixture was further stirred and heated overnight at 130° C. The reaction mixture was allowed to cool down to room temperature; after that it was poured into water and stirred for 30 minutes. The product was extracted with chloroform, then successively washed with water, and dried over MgSO$_4$. Removal of the solvent afforded the crude product which was then purified using column chromatography (silica gel, hexane:chloroform as eluent) gives the product as purple solid (11.0 g, 54%). 1H NMR (CDCl3): (0.87 (t, 12H), 1.13-1.45 (m, 64H), 1.89 (s, 2H), 4.00 (d, 4H), 7.26 (d, 2H), 7.52 (d, 2H), 8.87 (d, 2H). MS (MALDI-TOF) m/z 860.63 (M). calcd. for $C_{54}H_{88}N_2O_2S_2$=860.25.

Synthesis of 3,6-Bis-(5-bromo-thiophen-2-yl)-N,N'-bis((octyldodecyl)-1,4-dioxo-pyrrolo[3,4-c]pyrrole (1-4): Compound N,N'-bis(octyldodecyl)-3,6-dithienyl-1,4-diketopyrrolo[3,4-c]pyrrole (3) (7.0 g, 8.12 mmol) and 50 mL of chloroform were added to a 100 mL three neck flask equipped with a stirring bar, a condenser, and an addition funnel. Then, 0.832 mL (16.25 mmol) of bromine (Br$_2$) in 20 mL of chloroform was added to the flask at room temperature. The mixture was stirred at room temperature for overnight, next day the reaction mixture was then slowly poured in aqueous solution of sodium thiosulfate, water and stirred for additional 30 minutes. The product was extracted with chloroform, then successively washed with water, and dried over MgSO$_4$. Removal of the solvent afforded the crude product which was then purified using column chromatography (silica gel, hexane:chloroform as eluent) gives the product as dark purple solid (6.45 g, 78%). 1H NMR (CDCl3): 0.86 (t, 12H), 1.10-1.47 (m, 64H), 1.88 (s, 2H), 3.98 (d, 4H), 7.52 (d, 2H), 7.22 (d, 2H), 8.63 (d, 2H). MS (MALDI-TOF) m/z 1016.45 (M). calcd. for $C_{54}H_{86}Br_2N_2O_2S_2$=1017.45 (M+1).

Synthesis of 2,6-bis(4,4,5,5-tetramethyl-1,3,2-dioxabrolan-2-yl)naphthalene: 2,6-dibromonapthalene (3 g, 10.49 mmol), bis(pinacolato)diboron (6.45 g, 25.176 mmol), PdCl$_2$ (dppf) (1.54 g, 1.84 mmol), and KOAc (6.15 g, 61.52 mmol) was kept under vacuum for 10 minutes and then degassed 1,4-dioxane (40 mL) was added under argon. The reaction mixture was stirred at 80° C. for overnight. Then the reaction was quenched by adding water, and the resulting mixture was washed with ethyl acetate (100 mL). The organic layers were washed with brine, dried over MgSO$_4$, and concentrated in vacuum to yield black-brown solid. The solid was purified by silica gel chromatography by 3% ethyl acetate in hexane to give the desired compound as a white powder (2.5 g, 62%).

Synthesis of PDPP-OD-Np: To a schlenk flask 3,6-Bis-(5-bromo-thiophen-2-yl)-N,N'-bis((octyldodecyl)-1,4-dioxo-pyrrolo[3,4-c]pyrrole (0.350 g, 0.34 mmol), 2,6-bis(4,4,5,5-tetramethyl-1,3,2-dioxabrolan-2-yl)naphthalene (0.130 g, 0.34 mmol), $K_2CO_3$ (5 ml, 2 M) and 2 drops of aliquat 336 were dissolved in 10 ml toluene. The solution was purged with Argon for 30 minutes, and then tetrakis (triphenylphosphine) palladium (20 mg, 0.017 mmol) was added. The reaction was stirred at 80° C. for 3 days. Then a toluene solution of phenyl boronic acid was added followed by the addition of bromobenzene and stirred overnight. The resulting mixture was poured into a mixture of methanol and water and stirred overnight. The precipitated dark solid was redissolved in chloroform and added drop wise to methanol (250 ml). The resulting solid was filtered off and subjected to Soxhlet extraction for 2 days in methanol, acetone, and hexane for removal of oligomer and catalytic impurities. The residue was finally extracted with chloroform and precipitated again from methanol, filtered, washed with methanol, and dried. (250 mg, 74% yield).

Example 8

OTFT Devices Using PDPP-OD-Np

Top contact/bottom gate OTFT devices were fabricated as follows.

Substrate preparation: $p^+$-Si (or $n^+$-Si)/SiO$_2$ substrates were used for OTFT fabrication where $p^+$-Si (or $n^+$-Si) and SiO$_2$ function as gate contact and gate dielectric respectively. Substrates were subject to routine cleaning using ultrasonication in acetone, methanol and de-ionized water. The cleaned wafers were dried under a nitrogen flow and heated at 100° C. for 5 minutes. The cleaned and dried $p^+$-Si (or $n^+$—Si)/SiO$_2$ wafers were subject to UV-ozone treatment for 20 minutes.

Self-assembled monolayer (SAM) grown $p^+$-Si (or $n^+$-Si)/SiO$_2$ substrates: In order to improve organization of organic molecules on $p^+$-Si (or $n^+$-Si)/SiO$_2$ substrates, some substrates were treated with SAM octyltricholorosilane (OTS). $p^+$-Si (or $n^+$—Si)/SiO$_2$ substrates were kept in desiccator with few drops of OTS. Dessicator was first vacuumed for 3 minutes and placed in an oven at 110° C. for three hours. After that $p^+$-Si (or $n^+$-Si)/SiO$_2$ substrates were removed from desiccators, thoroughly rinsed with isopropanol and dried under a nitrogen flow.

Deposition of organic semiconductor thin film: Thin film of PDPP-OD-Np was deposited on above stated substrates by spin coating a solution of PDPP-OD-Np (8 mg/mL) in chloroform, followed by thermal annealing at 80° C., 120° C., 160° C. and 200° C., respectively under nitrogen.

Deposition of source/drain electrodes: Once organic thin films were grown on substrates, top contact bottom gate OTFTs were fabricated by depositing ~100 nm of gold as source and drain contacts using shadow masks. Our typical OTFT devices have 50, 100 and 200 µm channel length (L) in combination to 1 mm and 3 mm channel width (W).

The bottom-gate, top-contact OTFT devices (FIG. 3) were thus fabricated by spin coating 8 mg/mL solution of PDPP-OD-Np in chloroform on a $p^+$- (or $n^+$-) doped silicon wafer with a 200 nm thick thermally grown silicon oxide layer that was modified by a monolayer of octyltrichlorosilane. Some of the films were annealed at 120° C. under nitrogen for 10 min. After depositing gold source and drain electrodes on top of the polymer layer, the devices were characterized in a glove box under nitrogen using a Keithley 4200 parameter analyzer.

The evaluation of field-effect thin film transistor performance was accomplished in glove box under nitrogen using a Keithley 4200 parameter analyzer. The carrier mobility, µ, was calculated from the data in the saturated regime (gate voltage, $V_G$<source-drain voltage, $V_{SD}$) according to equation (a)

$$I_{SD}=C_i\mu(W/2L)(V_G-V_T)^2 \qquad (a)$$

where $I_{SD}$ was the drain current at the saturated regime, W and L were, respectively, the semiconductor channel width and length, $C_i$ was the capacitance per unit area of the gate dielectric layer, and $V_G$ and $V_T$ were, respectively, the gate voltage and threshold voltage. $V_T$ of the device was determined from the relationship between the square root of $I_{SD}$ at the saturated regime and $V_G$ of the device by extrapolating the measured data to $I_{SD}$=0.

Figure 9:
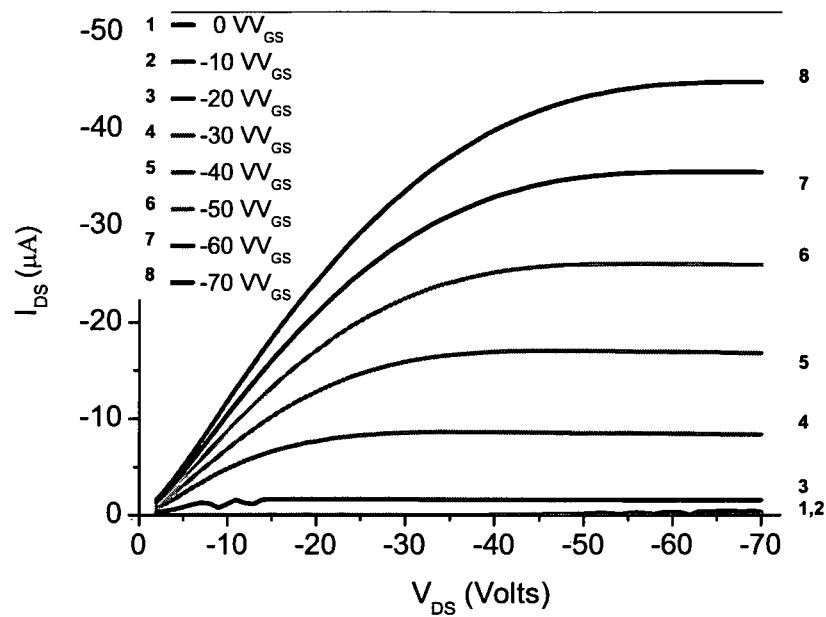
FIG. 9 is a graph showing output characteristic ($V_{DS}$ vs $I_{DS}$) of an OTFT comprising a compound of the invention (L=100 μm; W=1000 μm) on OTS treated n$^+$-Si/SiO$_2$ substrate having 120° C. pre-annealed thin film of polymer.
Figure 10:
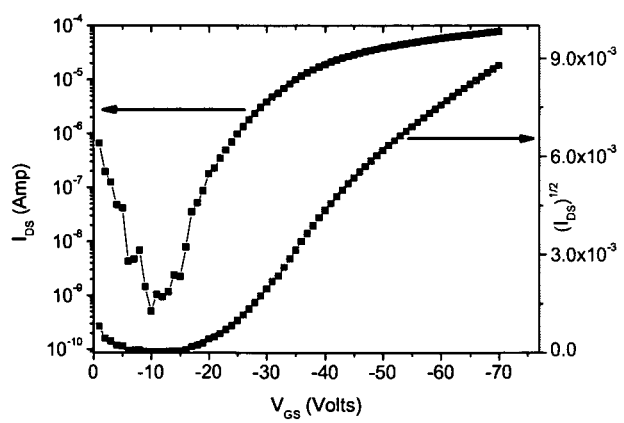
FIG. 10 is a graph showing transfer characteristics ($V_{GS}$-$I_{DS}$) of an OTFT comprising a compound of the invention (L=100 μm; W=1 mm) on OTS treated n$^+$-Si/SiO$_2$ substrate having 120° C. pre-annealed thin film of polymer.

OTFT devices of PDPP-OD-Np showed characteristic field effect performance as clearly seen in the output and transfer curves shown in FIG. 9 and FIG. 10. Hole mobility=0.47 cm$^2$/V·s for non-annealed devices and 0.65 cm$^2$/V·s for annealed devices (at 120° C.). The hole mobility obtained from the saturation regime is 0.47 cm$^2$/V·s ($V_{TH}$: −17.0 Volts, $I_{ON}/I_{OFF}$: ~10$^5$.) for non-annealed devices. The device with pre-annealed polymer film (120° C. for 10 min) showed an enhanced mobility value up to 0.65 cm$^2$/V·s ($V_{TH}$: −22.0 Volts, $I_{ON}/I_{OFF}$: ~10$^5$).

All publications and patent applications cited in this specification are herein incorporated by reference as if each individual publication or patent application were specifically and individually indicated to be incorporated by reference. The citation of any publication or patent application is for its disclosure prior to the filing date and should not be construed as an admission that the present invention is not entitled to antedate such publication or patent application by virtue of prior invention.

As used in this specification and the appended claims, the terms "comprise", "comprising", "comprises" and other forms of these terms are intended in the non-limiting inclusive sense, that is, to include particular recited elements or components without excluding any other element or component. As used in this specification and the appended claims, all ranges or lists as given are intended to convey any intermediate value or range or any sublist contained therein. Unless defined otherwise all technical and scientific terms used herein have the same meaning as commonly understood to one of ordinary skill in the art to which this invention belongs.

Although the foregoing invention has been described in some detail by way of illustration and example for purposes of clarity of understanding, it is readily apparent to those of ordinary skill in the art in light of the teachings of this invention that certain changes and modifications may be made thereto without departing from the spirit or scope of the appended claims.

REFERENCES

Bernede J C, Organic photovoltaic cells: History, principle and techniques, JOURNAL OF THE CHILEAN CHEMICAL SOCIETY, 2008, 53(3), 1549-1564.

Kroon R, Lenes M, Hummelen J C, Blom P W M, De Boer B, Small bandgap polymers for organic solar cells (polymer material development in the last 5 years), POLYMER REVIEWS, 2008, 48(3), 531-582.

Bundgaard E, Krebs F C, Low band gap polymers for organic photovoltaics, SOLAR ENERGY MATERIALS AND SOLAR CELLS, 2007, 91(11), 954-985.

Gunes S, Neugebauer H, Sariciftci N S, Conjugated polymer-based organic solar cells, CHEMICAL REVIEWS, 2007, 107(4), 1324-1338.

L. H. Slooff, S. C. Veenstra et al, Determining the internal quantum efficiency of highly efficient polymer solar cells through optical modeling, Appl. Phys. Lett. 90, 143506 2007.

N. Blouin, A. Michaud, M. Leclerc, A Low-Bandgap Poly(2, 7-Carbazole) Derivative for Use in High-Performance Solar Cells, Adv Mater 2007, 19, 2295.

Lu J P, Liang F S, Drolet N, Ding J F, Tao Y, Movileanu R, Crystalline low band-gap alternating indolocarbazole and benzothiadiazole-cored oligothiophene copolymer for organic solar cell applications, Chem. Commun. 2008, (42), 5315-5317.

Muhlbacher D, Scharber M, Morana M, Zhu Z, GWaller D, Gaudiana R, Brabec C, High photovoltaic performance of a low-bandgap polymer, Advanced Materials, 2006, 18(21), 2884.

Zhu, Z.; Waller, D.; Gaudiana, R.; Morana, M.; Mühlbacher, D.; Scharber, M.; Brabec, C. Panchromatic conjugated polymers containing alternating donor/acceptor units for photovoltaic applications, Macromolecules 2007, 40, 1981.

Peet, J.; Kim, J. Y.; Coates, N. E.; Ma, W. L.; Moses, D.; Heeger, A. J. Bazan, G. C. Efficiency enhancement in low-bandgap polymer solar cells by processing with alkane dithiols, Nat. Mater. 2007, 6, 497.

Hou, J.; Chen, H. Y.; Zhang, S.; Li, G.; Yang, Y. Synthesis, Characterization, and Photovoltaic Properties of a Low Band Gap Polymer Based on Silole-Containing Polythiophenes and 2,1,3-Benzothiadiazole, J. Am. Chem. Soc. 2008, 130, 16144.

Wang, E.; Wang, L.; Lan, L.; Peng, J.; Cao, Y. High-performance polymer heterojunction solar cells of a polysilafluorene derivative, Appl. Phys. Lett. 2008, 92, 033307.

Liang, Y.; Wu, Y.; Feng, D. Tsai, S.-T.; Son, H.-J.; Li, G.; Yu, L. Development of New Semiconducting Polymers for High Performance Solar Cells, J. Am. Chem. Soc. 2009, 131, 56.

Wienk, M. M.; Turbiez, M.; Gilot, J.; Janseen, R. A. J. Narrow-Bandgap Diketo-Pyrrolo-Pyrrole Polymer Solar Cells: The Effect of Processing on the Performance, Adv. Mater. 2008, 20, 2556.

Tamayo A B, Walker B, Nguyen T Q, A low band gap, solution processable oligothiophene with a diketopyrrolopyrrole core for use in organic solar cells, J. Phys. Chem. C, 2008, 112(30), 11545-11551.

Yingping Zou, David Gendron, Reda Badrou-Aich, Ahmed Najari, Ye Tao, and Mario Leclerc, A High-Mobility Low-Bandgap Poly(2,7-carbazole) Derivative for Photovoltaic Applications, Macromolecules, 2009, 42 (8), 2891-2894

WO2008000664A1 Diketopyrrolopyrrole polymers as organic semiconductors

EP2033983A2 Diketopyrrolopyrrole based polymers

EP2034537A2 Diketopyrrolopyrrole-based derivatives for thin film transistors

What is claimed is:

1. A compound of formula I:

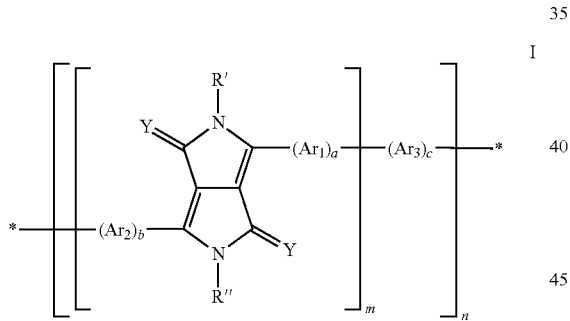

wherein

Y is P, S or Se;

each R' and R" is independently H or a hydrocarbon optionally containing one or more heteroatoms in the backbone;

each $Ar_1$ and $Ar_2$ is independently arylene, heteroarylene, —CH=CH—, —C≡C—, —CH=N—, —N=N— or —N=P—, any of which may be optionally substituted;

each $Ar_3$ is independently one of the following A1 to A3, A8, A9, A11, A13 A17 and A19 to A22 groups:

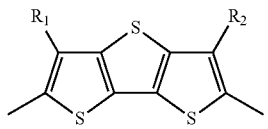

A1

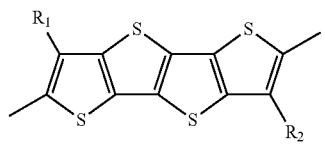

A2

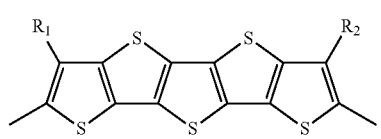

A3

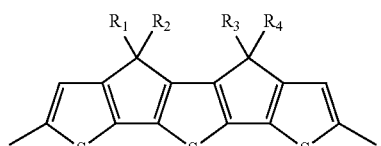

A4

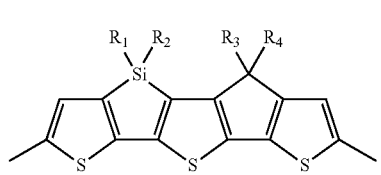

A5

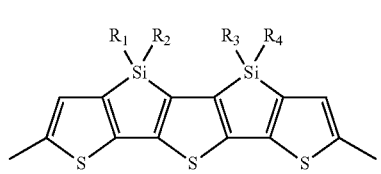

A6

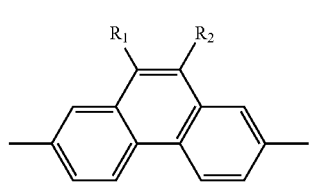

A8

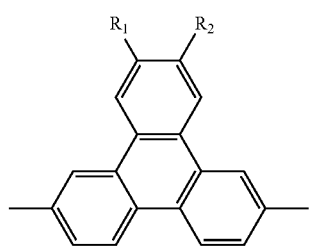

A9

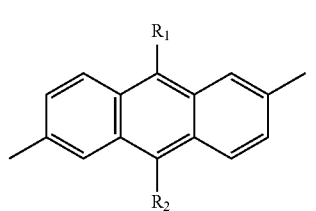

A11

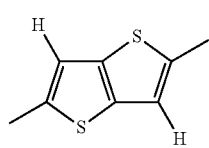

A12

-continued

A13
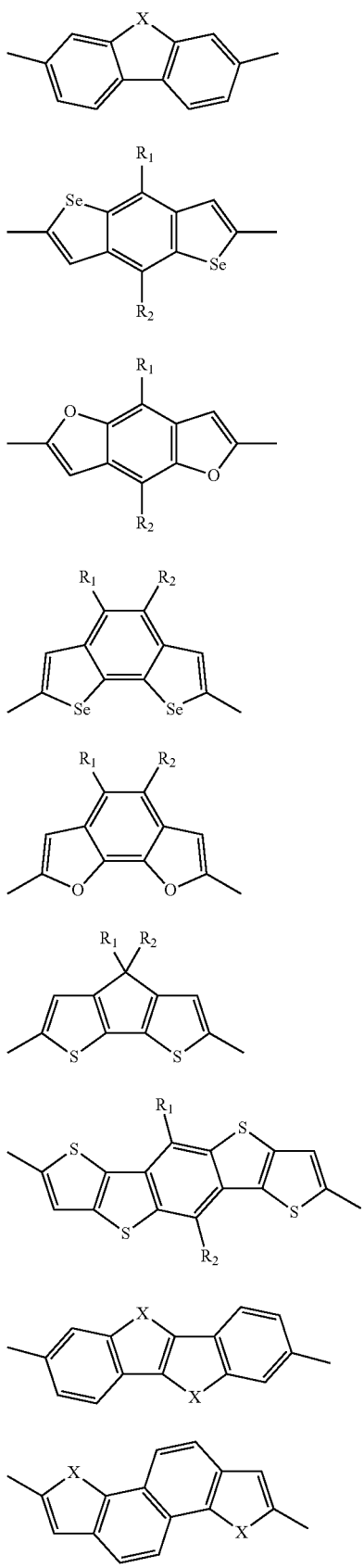

A14

A15

A16

A17

A18

A19

A20

A21

-continued

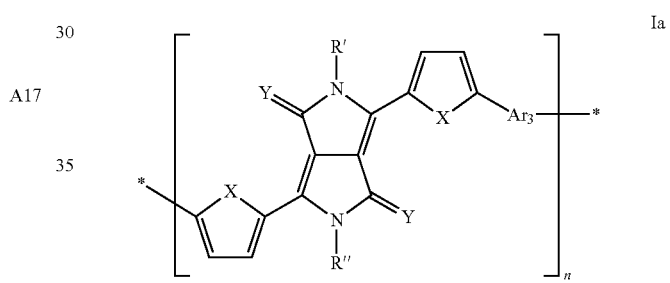
A22 each of $R_1$, $R_2$, $R_3$ and $R_4$ a hydrogen; straight or branched alkyl or heteroalkyl having from 1 to 40 backbone atoms; or aryl or heteroaryl having from 5 to 40 backbone atoms, any of which may be optionally substituted with one or more F, Cl, CN, $CO_2H$, $SO_3H$ or $NO_2$ groups;

X is O, S or Se;

each a and b is an integer from 0 to 20;

each c and m is an integer from 1 to 20; and n is an integer from 2 to 5000.

2. The compound of claim 1 having formula Ia

Ia wherein:
 each R' and R" is independently a straight alkyl, straight heteroalkyl, branched alkyl or branched heteroalkyl group, any of which having from 1 to 50 backbone atoms.

3. The compound of claim 2 wherein the compound is one of the following compounds Ia-3 to Ia-8 and Ia-10 to IA-14, Ia-17 to Ia-22, Ia-24 to Ia-28, Ia-30 to Ia-32, Ia-34 to Ia-39 and Ia-42 to Ia-46:

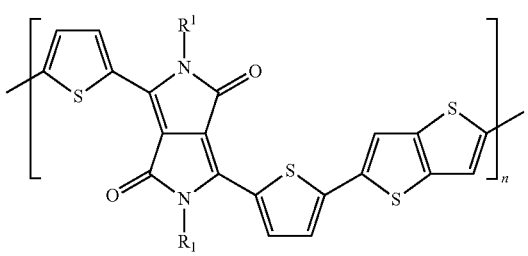
(Ia-2)

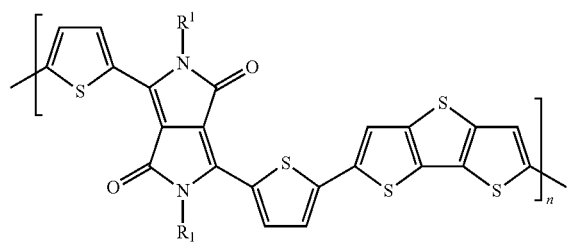
(Ia-3)
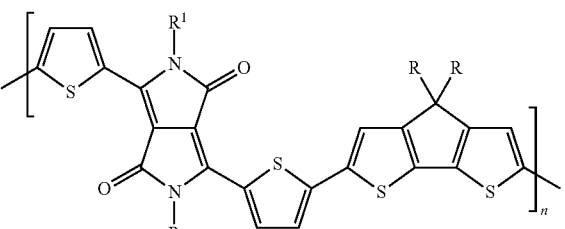
(Ia-9)
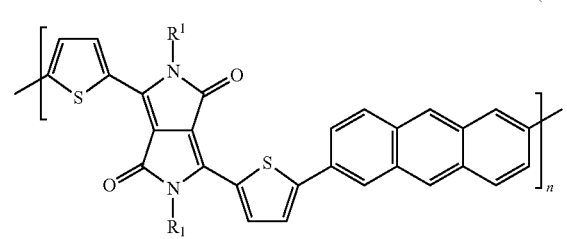
(Ia-4)
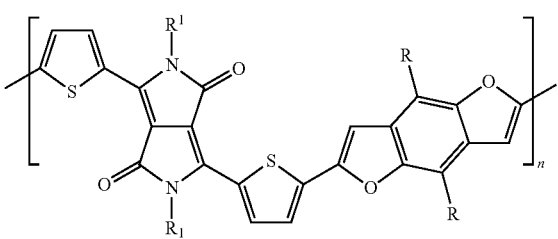
(Ia-10)
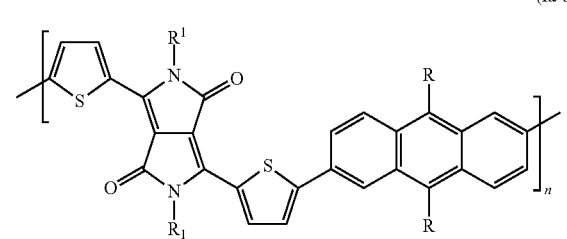
(Ia-5)
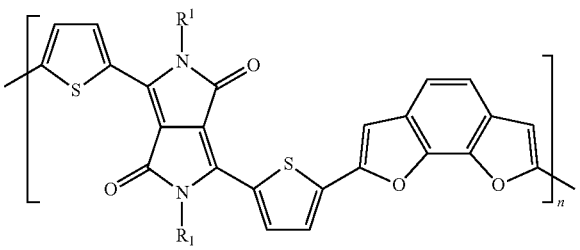
(Ia-11)
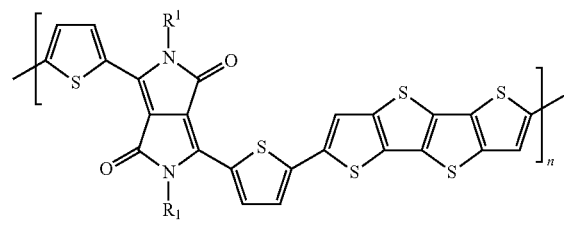
(Ia-6)
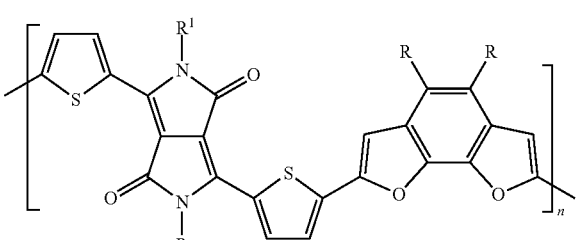
(Ia-12)
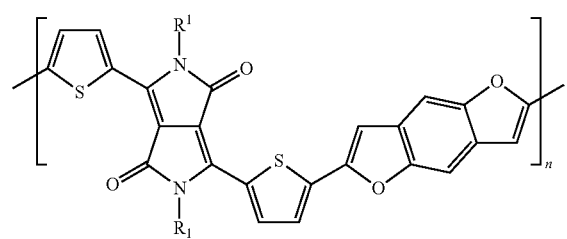
(Ia-7)
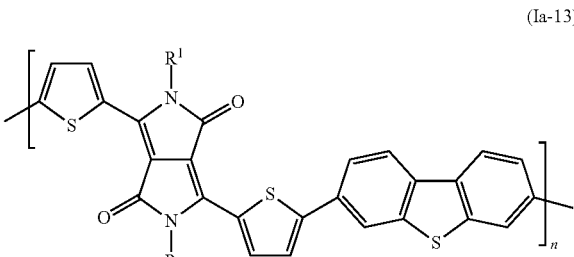
(Ia-13)
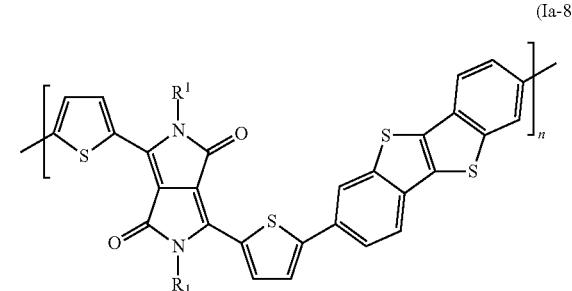
(Ia-8)
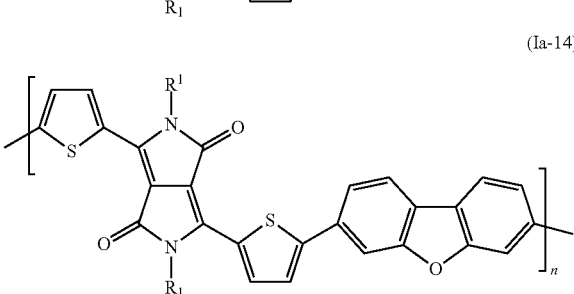
(Ia-14)

(Ia-17)
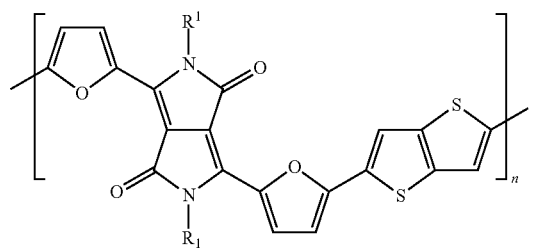
(Ia-18)
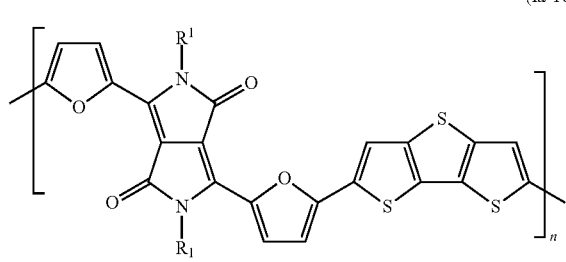
(Ia-19)
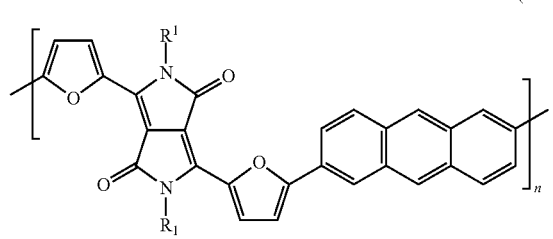
(Ia-20)
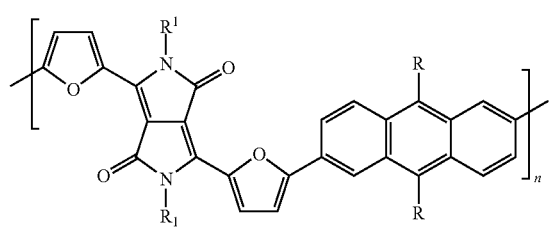
(Ia-21)
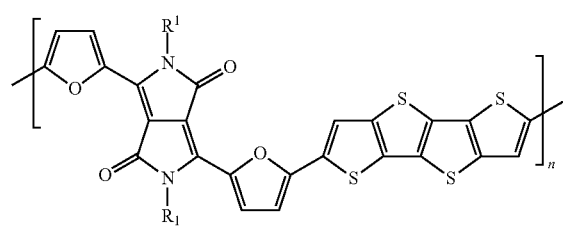
(Ia-22)
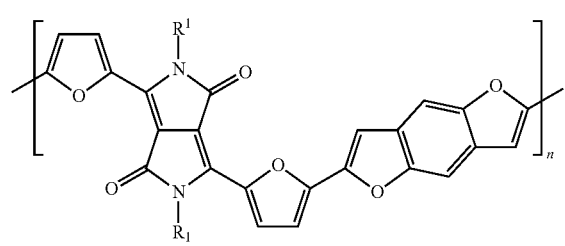
(Ia-23)
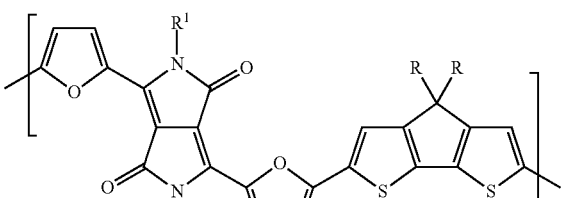
(Ia-24)
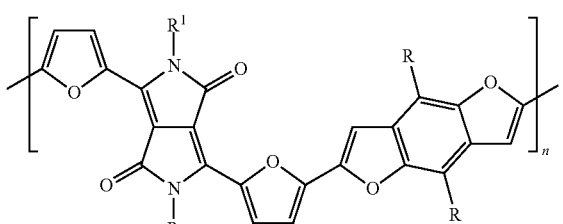
(Ia-25)
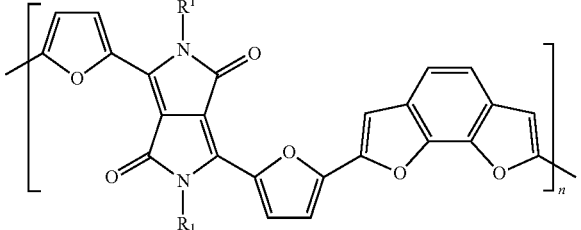
(Ia-26)
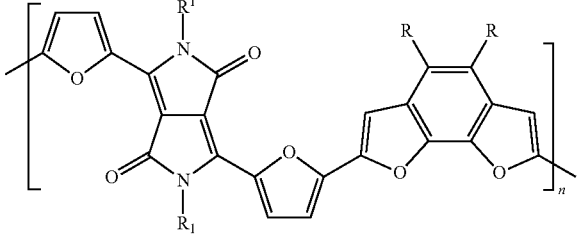
(Ia-27)
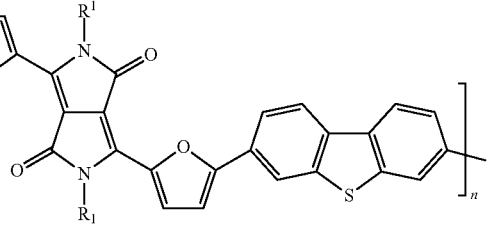
(Ia-28)
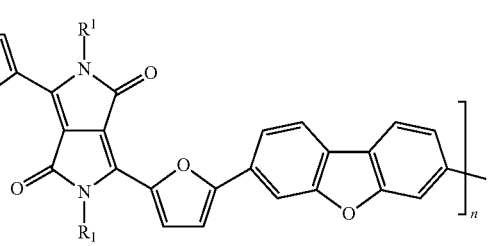

(Ia-30)
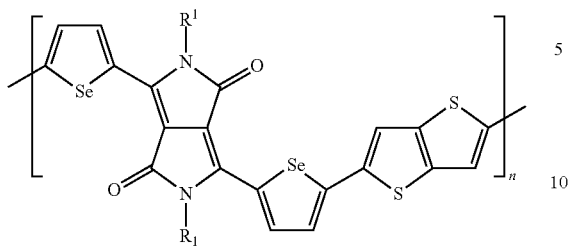
(Ia-31)
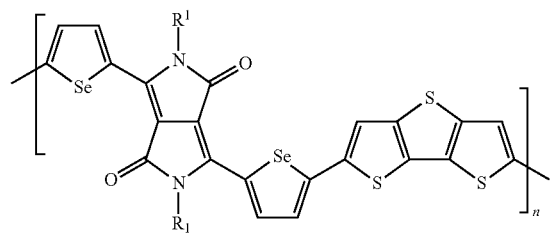
(Ia-32)
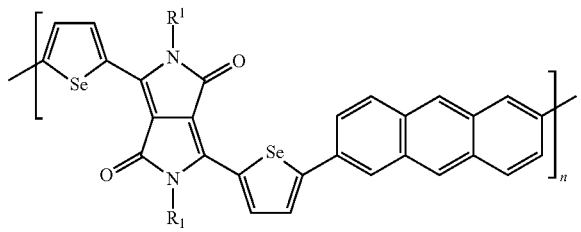
(Ia-34)
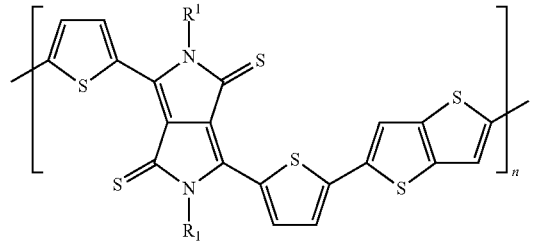
(Ia-35)
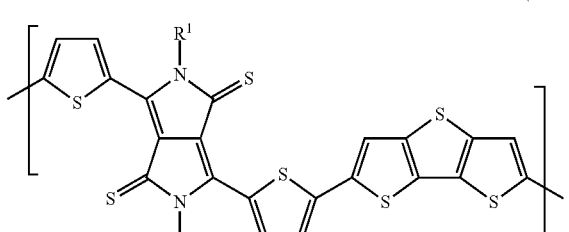
(Ia-36)
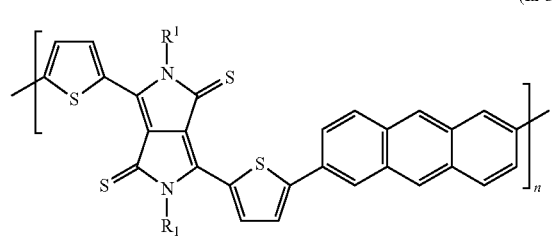
(Ia-36)
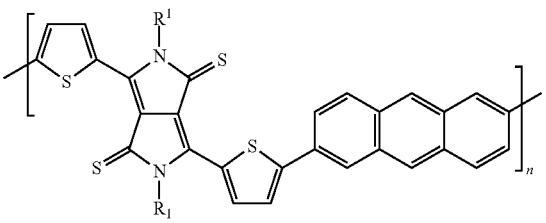
(Ia-37)
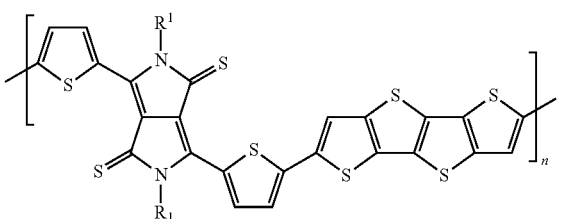
(Ia-38)
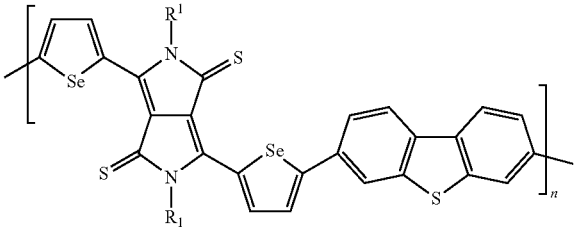
(Ia-39)
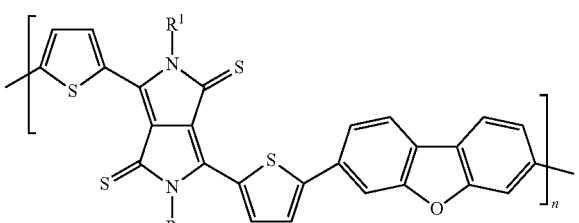
(Ia-42)
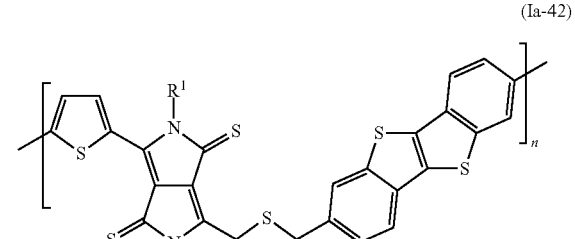
(Ia-43)
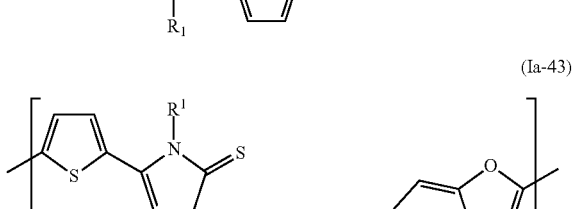

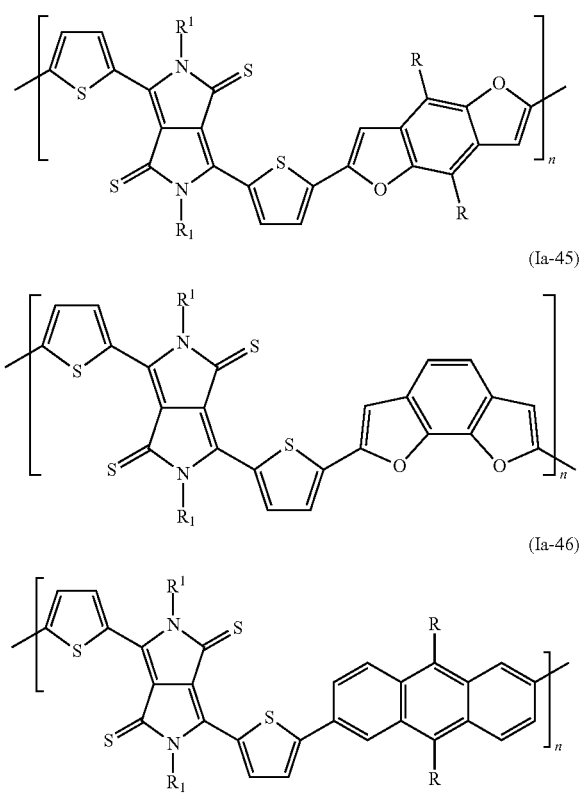

wherein each of R and $R_1$ is independently a straight or branched alkyl or heteroalkyl having from 1 to 40 backbone atoms, or aryl or heteroaryl having from 5 to 40 backbone atoms, any of which may be optionally substituted with one or more F, Cl, CN, $CO_2H$, $SO_3H$ or $NO_2$ groups; and n is an integer from 2 to 5000.

4. A thin film comprising a compound of claim 1.

5. The thin film of claim 4 wherein the thin film further comprises an electron acceptor material.

6. The thin film of claim 4 wherein the electron acceptor material comprises PCMB.

7. A device comprising a compound of claim 1.

8. The device of claim 7 comprising a thin film of claim 4.

9. A device comprising an anode, a cathode and an electron donor material comprising a compound of claim 1, the electron donor material disposed between the anode and the cathode.

10. The device of claim 9 wherein the electron donor material is in a photoactive layer.

11. The device of claim 10 wherein the photoactive layer further comprises an electron acceptor material.

12. The device of claim 11 wherein the acceptor material comprises PCMB.

13. The device of claim 9 further comprising an additional layer disposed between the photoactive layer and the anode, or between the photoactive layer and the cathode.

14. A thin film transistor comprising a gate electrode separated from a source electrode and a drain electrode by a gate dielectric, and a semiconductor material in contact with the gate dielectric, the semiconductor material comprising a compound of claim 1.

15. A thin film transistor comprising a gate electrode separated from a source electrode and a drain electrode by a gate dielectric, and a semiconductor material in contact with the gate dielectric, the semiconductor material comprising a thin film of claim 4.

* * * * *